United States Patent
Kim et al.

(10) Patent No.: US 8,592,979 B2
(45) Date of Patent: Nov. 26, 2013

(54) SEMICONDUCTOR DEVICE CONDUCTIVE PATTERN STRUCTURES AND METHODS OF MANUFACTURING THE SAME

(75) Inventors: Hei-Seung Kim, Suwon-Si (KR); Gil-Heyun Choi, Seoul (KR); Ji-Soon Park, Suwon-Si (KR); Jong-Myeong Lee, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/440,123

(22) Filed: Apr. 5, 2012

(65) Prior Publication Data

US 2012/0280391 A1 Nov. 8, 2012

(30) Foreign Application Priority Data

May 2, 2011 (KR) .................. 10-2011-0041497

(51) Int. Cl.
*H01L 23/48* (2006.01)
*H01L 23/52* (2006.01)
*H01L 29/40* (2006.01)

(52) U.S. Cl.
USPC ........... 257/751; 257/758; 257/266; 257/300; 257/306; 257/310; 257/312; 257/314; 257/318; 257/741; 257/776; 257/774; 257/E21.068; 257/E21.577; 257/E23.01; 257/E23.151; 257/E27.07; 438/627; 438/102; 438/240; 438/244; 438/253; 438/257; 438/266; 438/618; 438/622; 438/638

(58) Field of Classification Search
USPC ......... 257/201, 257, 261, 266, 296, 326, 377, 257/390, 751, 774, E23.011, E21.209, 257/E21.526, E21.613, E21.645–E21.66, 257/E23.067, E23.141–E23.175, 257/E21.575–E21.578, E21.627, E21.628, 257/E21.641, E27.07, E27.075–E27.085, 257/E27.098, E27.102–E27.104, E29.119, 257/E29.309, E29.33; 438/257, 266, 240, 438/244, 253, 254, 396–399, 618, 622, 638, 438/672–675, 6, 128, 598–599, 629
See application file for complete search history.

(56) References Cited

U.S. PATENT DOCUMENTS

| 7,586,175 B2 | 9/2009 | Lee et al. | |
| 2007/0289873 A1 | 12/2007 | Uchiumi | |
| 2008/0277794 A1* | 11/2008 | Uchikoshi et al. | ............ 257/758 |
| 2009/0242409 A1 | 10/2009 | Furuya | |
| 2010/0203672 A1* | 8/2010 | Eun et al. | ............ 438/102 |

FOREIGN PATENT DOCUMENTS

| JP | 2009-242861 | 10/2009 |
| KR | 2008-019501 | 1/2008 |

\* cited by examiner

*Primary Examiner* — Julio J Maldonado
*Assistant Examiner* — Lawrence-Linh T Nguyen
(74) *Attorney, Agent, or Firm* — Volentine & Whitt, PLLC

(57) ABSTRACT

A conductive pattern structure includes a first insulating interlayer on a substrate, metal wiring on the first insulating interlayer, a second insulating interlayer on the metal wiring, and first and second metal contacts extending through the second insulating interlayer. The first metal contacts contact the metal wiring in a cell region and the second metal contact contacts the metal wiring in a peripheral region. A third insulating interlayer is disposed on the second insulating interlayer. Conductive segments extend through the third insulating interlayer in the cell region and contact the first metal contacts. Another conductive segment extends through the third insulating interlayer in the peripheral region and contacts the second metal contact. The structure facilitates the forming of uniformly thick wiring in the cell region using an electroplating process.

14 Claims, 25 Drawing Sheets

SEMICONDUCTOR DEVICE CONDUCTIVE PATTERN STRUCTURES AND METHODS OF MANUFACTURING THE SAME

CROSS-REFERENCE TO RELATED APPLICATIONS AND CLAIM OF PRIORITY

This application claims priority under 35 U.S.C. §119 to Korean Patent Application No. 10-2011-0041497, filed on May 2, 2011 in the Korean Intellectual Property Office, the contents of which are incorporated herein by reference in their entirety.

BACKGROUND

The inventive concept relates to semiconductor device conductive pattern structures and methods of manufacturing the same. More particularly, the inventive concept relates to semiconductor device conductive pattern structures including copper wiring and methods of manufacturing the same using an electroplating process.

As semiconductor devices including metal wiring become more highly integrated, the resistance of the metal wiring and capacitance between wires increase. Because of its low resistance, copper has been thus widely used as the wiring of semiconductor devices. Copper wiring may be formed by forming a groove in a substrate, and electroplating the substrate to fill the groove with copper. Typically, the current used to conduct the electroplating is distributed by outer conductive patterns in the cell region of the device and contacts to various other cells in the cell region. However, the electroplating current may not be great enough to form the desired copper wiring pattern for the cell region. In particular, the copper wiring pattern may be too thin or may have a void therein at locations of the cells where the electroplating current is weak due to its pathways of distribution.

SUMMARY

According to an aspect of the inventive concept, there is provided a conductive pattern structure having a dedicated cell region and a dedicated peripheral region outside the cell region, and in which a cell current-distributing conductive pattern is provided in the peripheral region. The conductive pattern structure includes a substrate, a first insulating interlayer disposed on the substrate and extending in the cell region and the peripheral region, metal wiring on the first insulating interlayer and extending in both the cell region and the peripheral region, a second insulating interlayer on the first insulating interlayer and covering the metal wiring, first metal contacts extending through the second interlayer insulating layer in the cell region and contacting the metal wiring, a second metal contact extending through the second interlayer insulating layer in the peripheral region and also contacting the metal wiring, a third insulating interlayer on the second insulating interlayer and extending in the cell region and the peripheral region, and a cell current-distributing conductive pattern extending through the third insulating interlayer in the cell region and constituted by segments of conductive material contacting the first metal contacts, respectively. The peripheral current-distributing conductive pattern extends through the third insulating interlayer in the peripheral region and contacts the second metal contact.

According to another aspect of the inventive concept, there is provided a semiconductor device having a cell region and a peripheral region outside the cell region, and in which a cell current-distributing conductive pattern is provided in the peripheral region. Among the cell and peripheral regions, memory devices are provided only in the cell region and are disposed at an upper portion of a substrate. A first insulating interlayer is disposed on the substrate and extends in the cell region over the memory devices and in the peripheral region. Metal wiring is disposed on the first insulating interlayer and extends in both the cell region and the peripheral region. A second insulating interlayer is disposed on the first insulating interlayer and covers the metal wiring. First metal contacts and a second metal contact extend through the second interlayer insulating layer. The first metal contacts each contact the metal wiring in the cell region and the second metal contact contacts the metal wiring in the peripheral region. A third insulating interlayer is disposed on the second insulating interlayer and extends in the cell region and the peripheral region. A first conductive pattern extends through the third insulating interlayer in the cell region and is constituted by first conductive segments that do not contact any conductive contact that extends through the second insulating interlayer and into contact with the metal wiring. A second conductive pattern extends through the third insulating interlayer in the cell region and is constituted by segments of conductive material contacting the first metal contacts, respectively. The peripheral current-distributing conductive pattern extends through the third insulating interlayer in the peripheral region and contacting the second metal contact.

According to another aspect of the inventive concept, there is provided a method of manufacturing a structure having a dedicated cell region and a dedicated peripheral region located outside the cell region, the method comprising: forming a first insulating interlayer on a substrate including in the cell region and a peripheral region, forming a metal wiring on the first insulating interlayer, forming a second insulating interlayer having first metal contacts extending therethrough in the cell region and a second metal contact extending therethrough in the peripheral region wherein the second insulating layer is formed on the first insulating layer and the first and second metal contacts each contact the metal wiring, forming a third insulating interlayer on the second insulating interlayer, etching the third insulating interlayer to form trenches therethrough in the cell region and in the peripheral region that expose the first and second metal contacts, respectively, and filling the trenches with copper including by performing an electroplating process.

BRIEF DESCRIPTION OF THE DRAWINGS

The inventive concept will be more clearly understood from the following detailed description of preferred embodiments made in conjunction with the accompanying drawings, of which:

FIGS. 3-8 together illustrate a method of manufacturing the conductive pattern structure illustrated in FIGS. 1 and 2 in accordance with the inventive concept, wherein FIGS. 3, 4 and 6 to 8 are cross-sectional views and FIG. 5 is a plan view of the conductive pattern structure during the course of its manufacture.

DETAILED DESCRIPTION OF THE PREFERRED EMBODIMENTS

Figure 1:
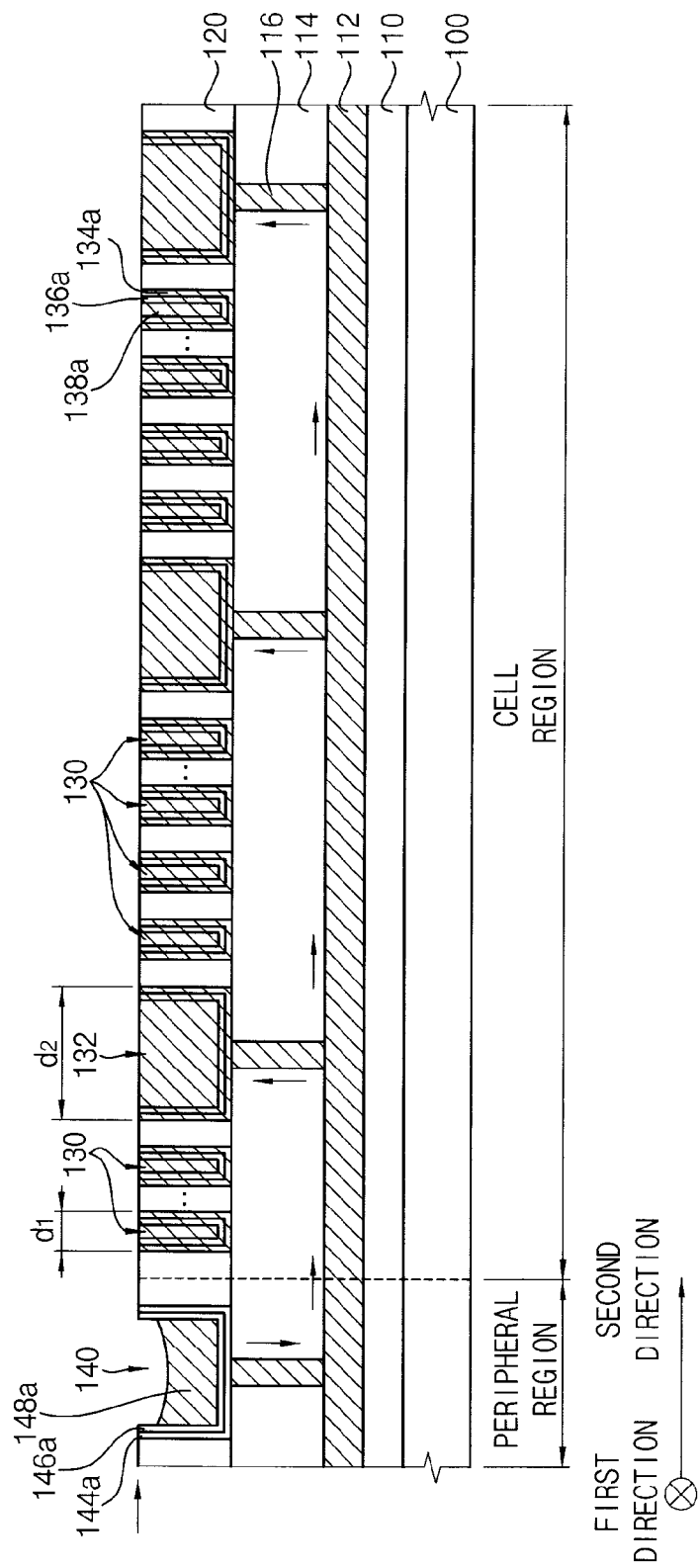
FIG. 1 is a cross-sectional view of a conductive pattern structure in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it may be directly on or directly connected to the other element or layer or intervening elements or layers may be present. In contrast, when an element or layer is referred to as being "directly on" or "directly connected to" or in "contact" with another element or layer, there are no intervening elements or layers present.

It will also be understood that although the terms first, second, third, etc. are used herein to describe various elements, layers, features, etc., these elements, layers and/or features are not limited by these terms. These terms are only used for purposes of description and understanding to distinguish one element, layer or feature from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "pattern" will generally refer to one or a series of discrete features in a layer, such as occurs when a layer of material in the art is etched. And the term "extending" when used in conjunction with some feature or element will generally refer to a lengthwise or elongated direction of that feature or element even if not expressly mentioned.

An example of a conductive pattern structure in accordance with the inventive concept will now be described with reference to FIGS. 1 and 2. The conductive pattern structure has a cell region and a peripheral region, and includes a substrate, insulating interlayers on the substrate, and conductive patterns in an upper one of the insulating interlayers, wherein the conductive patterns include a first conductive (wiring) pattern in the cell region, and cell and current-distributing conductive patterns in the cell and peripheral regions, respectively, for distributing current used in an electroplating process.

More specifically, in this example, the insulating interlayers include a first insulating interlayer 110, a second insulating interlayer 114, and a third insulating interlayer 120. The conductive patterns include a first conductive pattern 130 disposed within the third insulating interlayer 120 in the cell region, a peripheral current-distributing conductive pattern 140 disposed within the third insulating interlayer 120 in the peripheral region (referred to hereinafter simply as "current-distributing conductive pattern 140"), and a cell current-distributing conductive pattern 132 (referred to hereinafter as the "second conductive pattern 132") disposed within third insulating interlayer 120 in the cell region as interspersed among the first conductive pattern 130. Furthermore, the first conductive pattern 130 is a wiring pattern (for semiconductor devices, for example) comprising linear segments of conductive material extending lengthwise in a first direction to opposite end portions of a cell block in the cell region. Also, in this example, the current-distributing conductive pattern 140 is aligned with the second conductive pattern 130 in a second direction (perpendicular to the first direction in this example) corresponding to a direction in which chips to mounted on the structure are to be arrayed.

In addition, switching devices (not shown in the figures) may be provided on the substrate 100 in the cell region. The switching devices may be transistors. In this case, the first insulating interlayer 110 covers the switching devices on the substrate 100.

The first insulating interlayer 110 may include silicon oxide, silicon oxynitride, or the like.

The conductive pattern structure in this example also includes a first metal wiring 112, metal contacts 116 extending through the second insulating interlayer 114 and contacting the first metal wiring 112, and contact plugs (not illustrated) extending through the first insulating interlayer 110 and into contact with (electrically) active regions of the substrate 100.

The first metal wiring 112 is a linear segment of metal such as tungsten or copper. Furthermore, the first metal wiring 112 extends lengthwise in the second direction as interposed between the first and second insulating interlayers 110 and 114. Also, the first metal wiring 112 may contact or otherwise be electrically conductively connected with the contact plugs extending through the first insulating interlayer 110.

The second insulating interlayer 114 covers the first metal wiring 112, and the third insulating interlayer 120 is disposed on the second insulating interlayer 114.

The first and second conductive patterns 130 and 132 may include copper. For example, the first and second conductive patterns 130 and 132 may include integrated layers consisting of a layer pattern 134a of a barrier metal, a copper seed layer pattern 136a and a copper layer pattern 138a.

Furthermore, the first conductive pattern 130 and the second conductive pattern 132 in this example are each a line and space pattern, and the line width d2 of the second conductive pattern 132 is greater than the line width d1 of the first conductive pattern 130.

More specifically, the first conductive pattern 130 is made up of linear (line) segments of conductive material extending in the first direction, each having a width d1 and spaced from each other in the second direction by regular intervals which may be equal to the line width d1. Likewise, the second conductive pattern 132 is made up of linear (line) segments of conductive material extending in the first direction. In this respect, though, the line width d2 of the second conductive pattern 132 is preferably three times greater or more than the line width d1. Furthermore, the intervals between each line segment of the second conductive pattern 132 and the adjacent segments of the first conductive pattern 130 may be the same as the line width d1 of the first conductive pattern 130.

Also, most of the conductive lines constituting the first conductive pattern 130 extend in the first direction from one side to the other of a cell. On the other hand, other conductive lines 133 constituting first conductive pattern 130 are relatively short and are disposed in the same rows as the conductive lines constituting the second conductive pattern 132.

The current-distributing conductive pattern 140 is disposed in the peripheral region adjacent a portion of the first conductive pattern 130, i.e., adjacent one or more of the segments of the first conductive pattern 130. That is, one or more of the segments of the first conductive pattern 130 is/are interposed between the current-distributing conductive pattern 140 and the second conductive pattern 132. Also, the current-distributing conductive pattern 140, like the first and second conductive patterns 130 and 132, may include integrated layers including a layer pattern 144a of a barrier metal, a copper seed layer pattern 146a and a copper layer pattern 148a.

According to an aspect of the inventive concept, in the conductive pattern structure described above, the first and second conductive patterns 130 and 132 are wiring patterns for active devices such as chips, whereas the current-distributing conductive pattern 140 is essentially a dummy pattern. Also, the metal contacts 116 contact the bottom surfaces, respectively, of the conductive segments constituting the current-distributing conductive pattern 140 and second conductive pattern 132. In addition, each of the metal contacts 116 is conductively connected to the underlying first metal wiring 112. Furthermore, the current-distributing conductive pattern 140 is disposed in the peripheral region and the first and second conductive patterns 130 and 132 are disposed in the cell region. Therefore, the current-distributing conductive pattern 140 may be provided nearer to a voltage source, for supplying an electroplating current to the substrate 100, than the first and second conductive patterns 130 and 132.

That is, when a potential difference for facilitating an electroplating process is to be impressed across the substrate 100, the electroplating current is firstly supplied to the current-distributing conductive pattern 140. Then, the electroplating current may be distributed by the current-distributing conductive pattern 140 from the peripheral region to the second conductive pattern 132 in the cell region.

To facilitate this process, the copper layer pattern 148a of the current-distributing conductive pattern 140 may be thinner than the copper layer pattern 138a of the second conductive pattern 132. Also, in this regard, the copper layer pattern 138a of the second conductive pattern 132 in the cell region is designed to be thick enough to transmit a sufficient amount of the electroplating current.

The width d3 of the current-distributing conductive pattern 140 (dimension of the conductive segment of the current-distributing pattern 140 as taken in the widthwise directions of the first and second conductive patterns 130 and 132) may the same as or greater than the line width d2 of the second conductive pattern 132. In the case in which the width d3 is greater than the width d2, the flow of current from the current-distributing conductive pattern 140 to the second conductive pattern 132 is accelerated.

A method of manufacturing the conductive pattern structure illustrated in FIGS. 1 and 2 will now be described with reference to FIGS. 3 to 8.

Figure 3:
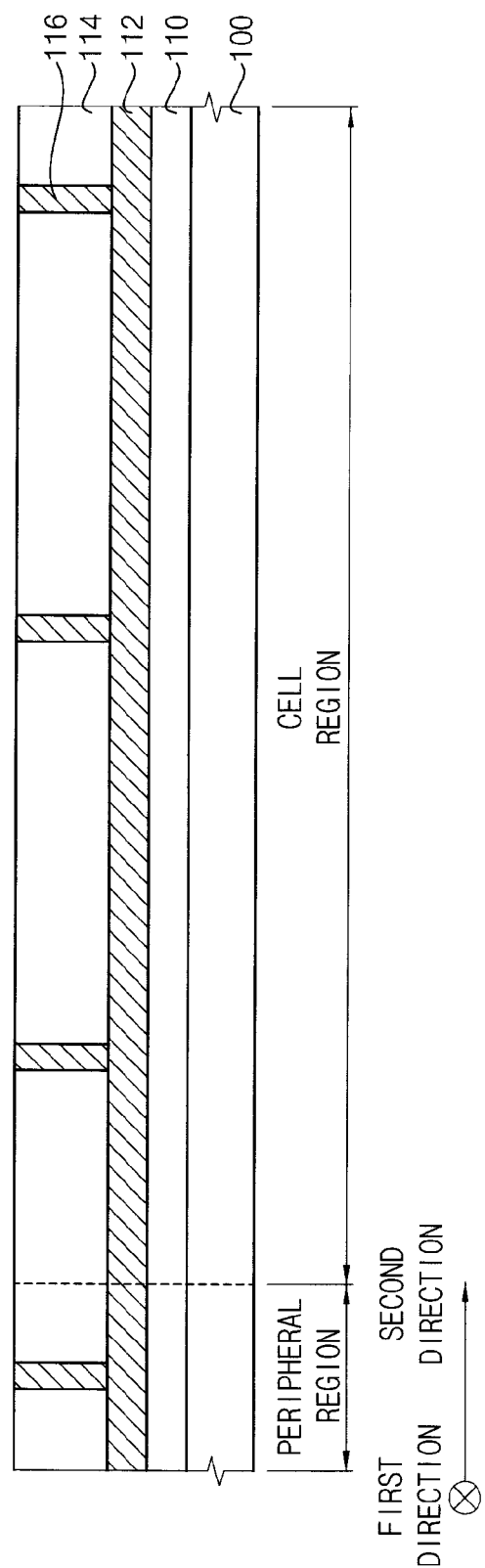

Referring to FIG. 3, devices (not illustrated) including transistors constituting semiconductor devices are formed on substrate 100. Then, first insulating interlayer 110 is formed over the devices. The first insulating interlayer 110 may be formed of silicon oxide, silicon oxynitride, or silicon oxide doped with impurities. Furthermore, the first insulating interlayer 110 may then be planarized so as to have a planar upper surface.

Contact plugs (not illustrated) may be formed through the first insulating interlayer 110 and into contact with active regions, e.g., source/drain regions of the transistors formed in the substrate 100. The contact plugs may be formed of doped polysilicon or metal.

Next, first metal wiring 112 of tungsten or copper, for example, is formed on the first insulating interlayer 110 as electrically connected to the contact plugs. In this respect, the first metal wiring 112 may be formed by a deposition and patterning process (process of depositing a layer of metal on the insulating layer 110, forming a mask on the metal layer and etching the layer using a mask) or by a damascene process (forming a recess in the insulating interlayer 110, filling the recess with metal including by depositing a layer of metal on the recessed interlayer 110 to such a thickness as to fill the recess, and subsequently planarizing the layer until the upper surface of the interlayer 110 is exposed). In either case, the first metal wiring 112 may be formed so as to have the shape of a line, i.e., is elongated in a first direction.

Second insulating interlayer 114 is then formed over the first metal wiring 112. The second insulating interlayer 114 is then etched to form contact holes and the contact holes are filled with metal by a process known in the art, per se, to form metal contacts 116.

Figure 4:
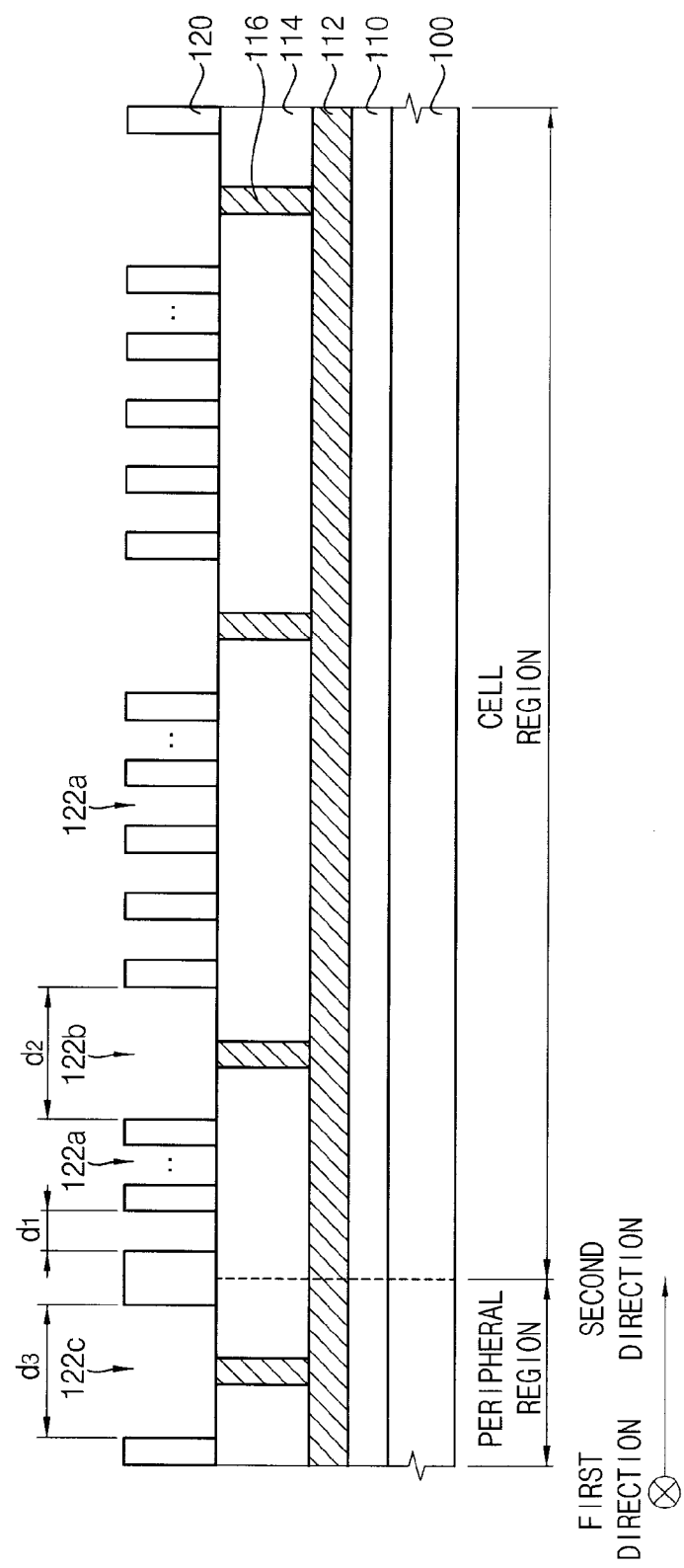
Figure 5:
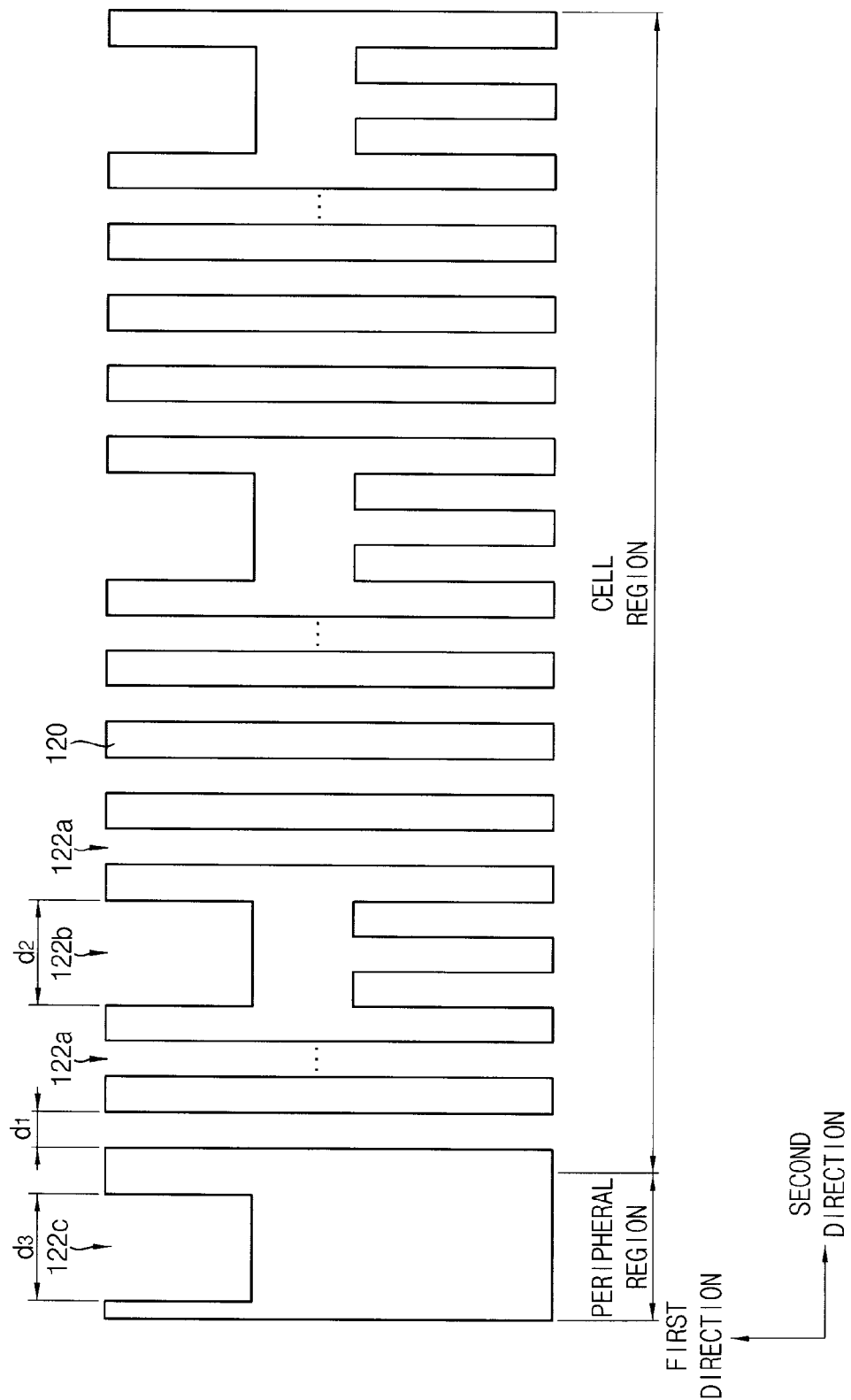

Referring to FIGS. 4 and 5, third insulating interlayer 120 including trenches 122a, 122b and 122c is formed on the second insulating interlayer 114. The trenches 122a-122c may be formed by a photolithography process (depositing a layer of insulating material on the second insulating interlayer 116, forming a layer of photoresist on the layer of insulating material, exposing and developing the layer of photoresist to form a photoresist pattern, and etching the layer of insulating material using the photoresist pattern as a mask). The trenches 122a-122c formed in the third insulating interlayer 120 include first trenches 122a and second trenches 122b in the cell region, and a third trench 122c in the peripheral region.

The first trenches 122a each have a first line width d1 and are each elongated in the first direction. Also, the first trenches 122a may be spaced from each other by distances equal to about the first width d1. The second trenches 122b are formed in the cell region near respective ones of the first trenches 122a and each have a width d2 greater than the width d1 of each first trench 122a. More specifically, each of the second trenches 122b is formed so as to be located between respective ones of the first trenches 122a. The second trenches 122b are also elongated in the first direction.

The third trench 122c is formed near a side of one of the first trenches 122a. The third trench 122c is also elongated in the first direction and is formed at the same level as the second trenches 122b as aligned therewith in a second direction perpendicular to the first direction. Furthermore, in practice, a number of the third trenches 122c may be formed corresponding to the number of chip arrays. A chip array is an array of chips that are to be mounted to the structure and in which the chips of each array are spaced from one another in the second direction. In any case, each third trench 122c has a width d3 which is the same as or greater than the width d2 of the second trenches 122b.

Figure 6:
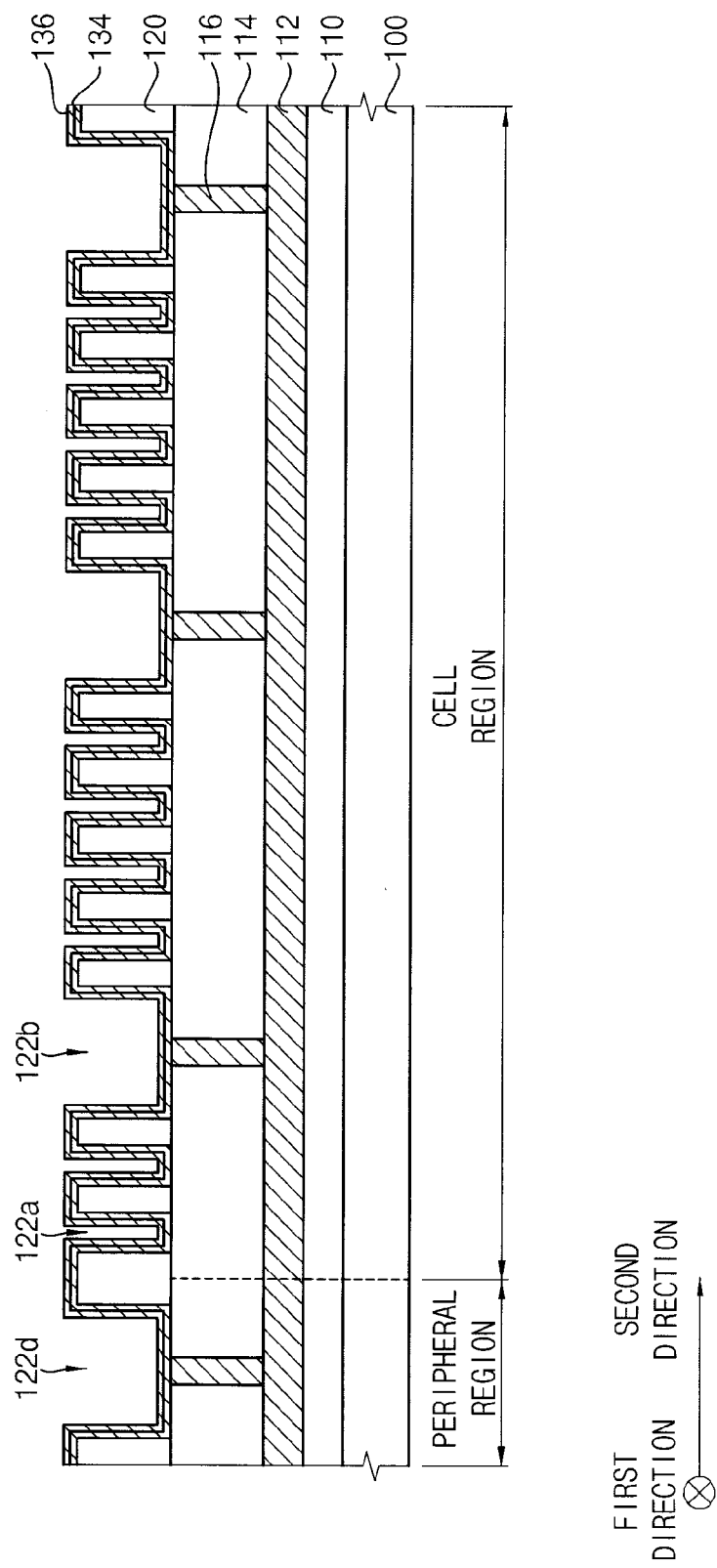

Referring to FIG. 6, in the example of this method, barrier metal layer 134 is formed on inner walls that delimit the trenches 122a-122c and on upper surface of the third insulating interlayer 120, and copper seed layer 136 is formed on the barrier metal layer 134. The barrier metal layer 134 is formed, for example, of at least one material selected from the group consisting of titanium, titanium nitride, tantalum, and tantalum nitride by a physical vapor deposition process or a chemical vapor deposition process. The copper seed layer 136 is formed by the physical vapor deposition process.

Figure 7:
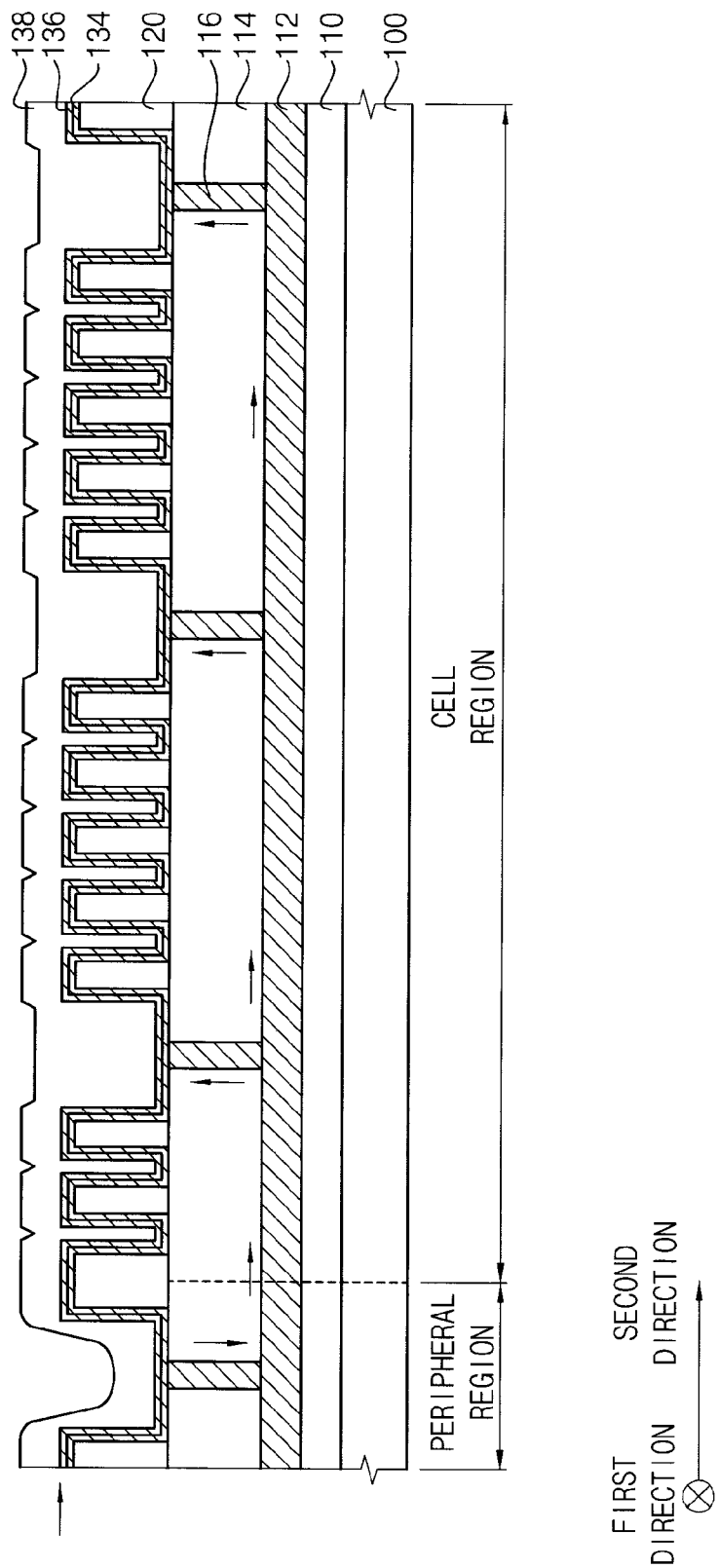

Referring to FIG. 7, copper layer 138 is formed on the copper seed layer 136 to such a thickness as to fill the trenches 122a-122c.

The copper layer 138 is formed by an electroplating process. In particular, a cathode of an electric electroplating apparatus is connected to the backside of the substrate 100 and an anode is connected to the front side of the substrate 100. Also, the substrate 100 is immersed in an electroplating solution. Then, a voltage is applied to the anode and the cathode to cause electroplating current to flow through the copper seed layer 136 (in the direction designated by arrows in FIG. 7). As a result, the copper seed layer 136 is coated with electrolyzed copper from the electroplating solution to form the copper layer 138.

The electroplating process will be explained in further detail hereinafter with regard to the trenches 122a-122c illustrated in and described with reference to FIG. 4.

When a voltage is applied to the substrate 100, the electroplating current flows through the copper seed layer 136 formed in the third trench 122c to the copper seed layer 136 formed in the second trenches 122b, via the underlying first metal wiring 122 and the metal contacts 116. Accordingly, when the voltage is applied to the substrate 100 to induce a potential difference in the structure, the potential difference across the copper seed layer 136 within the third trench 122c, i.e., the trench nearest to the voltage source, is lower than the potential difference across the trenches in the cell region. As a result, the copper layer 138 formed within the third trench 122c may be relatively thin (as shown in FIG. 7) and a void may be created in the copper layer 138 in the third trench 122c. In the other hand, the copper layer 138 formed within the second trenches 122b near the third trench 122c and the copper layer 138 may be relatively thick, e.g., as thick as the copper layer 138 formed in the relatively narrow first trenches 122a. Accordingly, defects near the edge of the cell region due to insufficient electroplating current are prevented.

Figure 2:
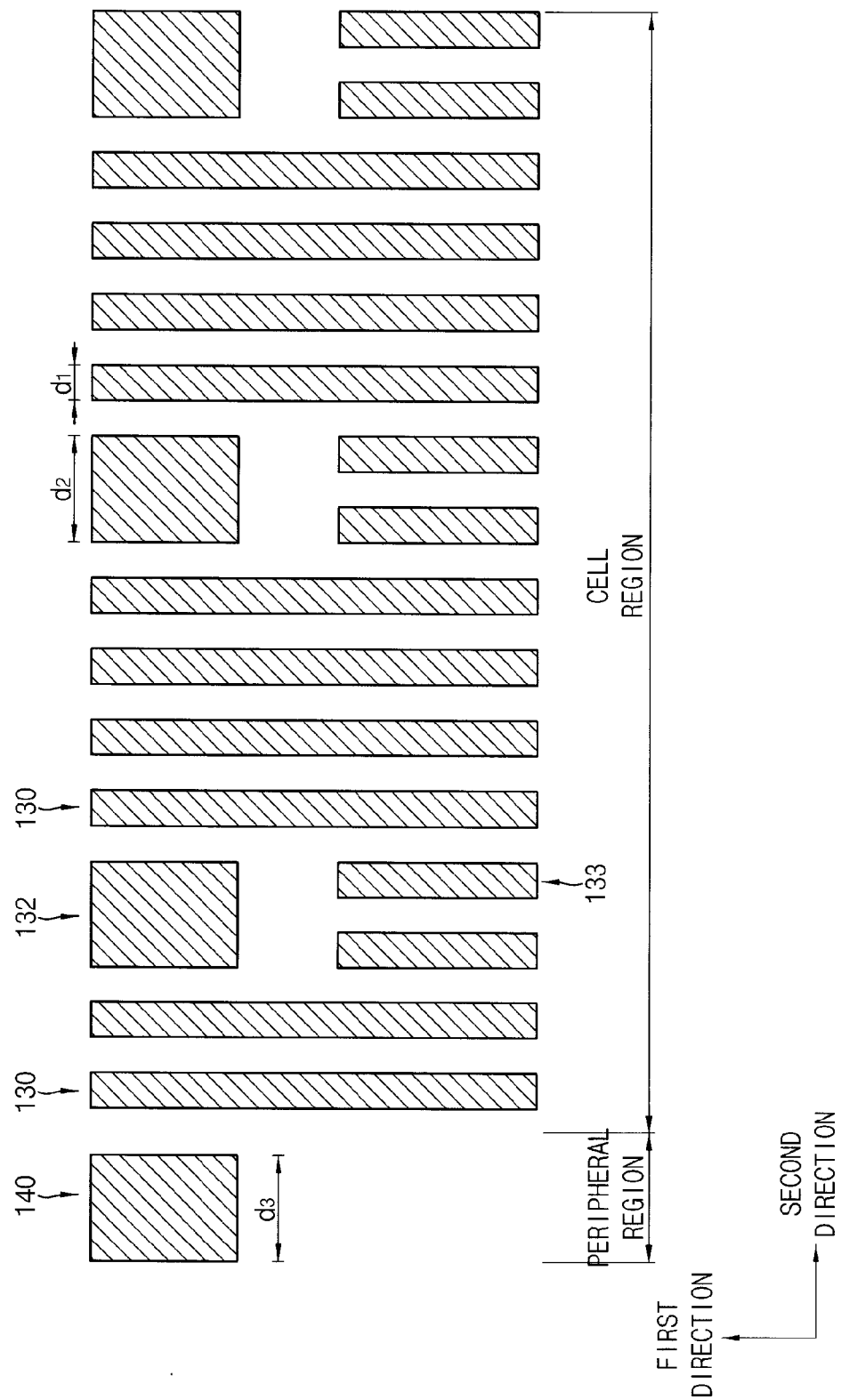
FIG. 2 is a plan view of the conductive pattern structure illustrated in FIG. 1.
Figure 8:
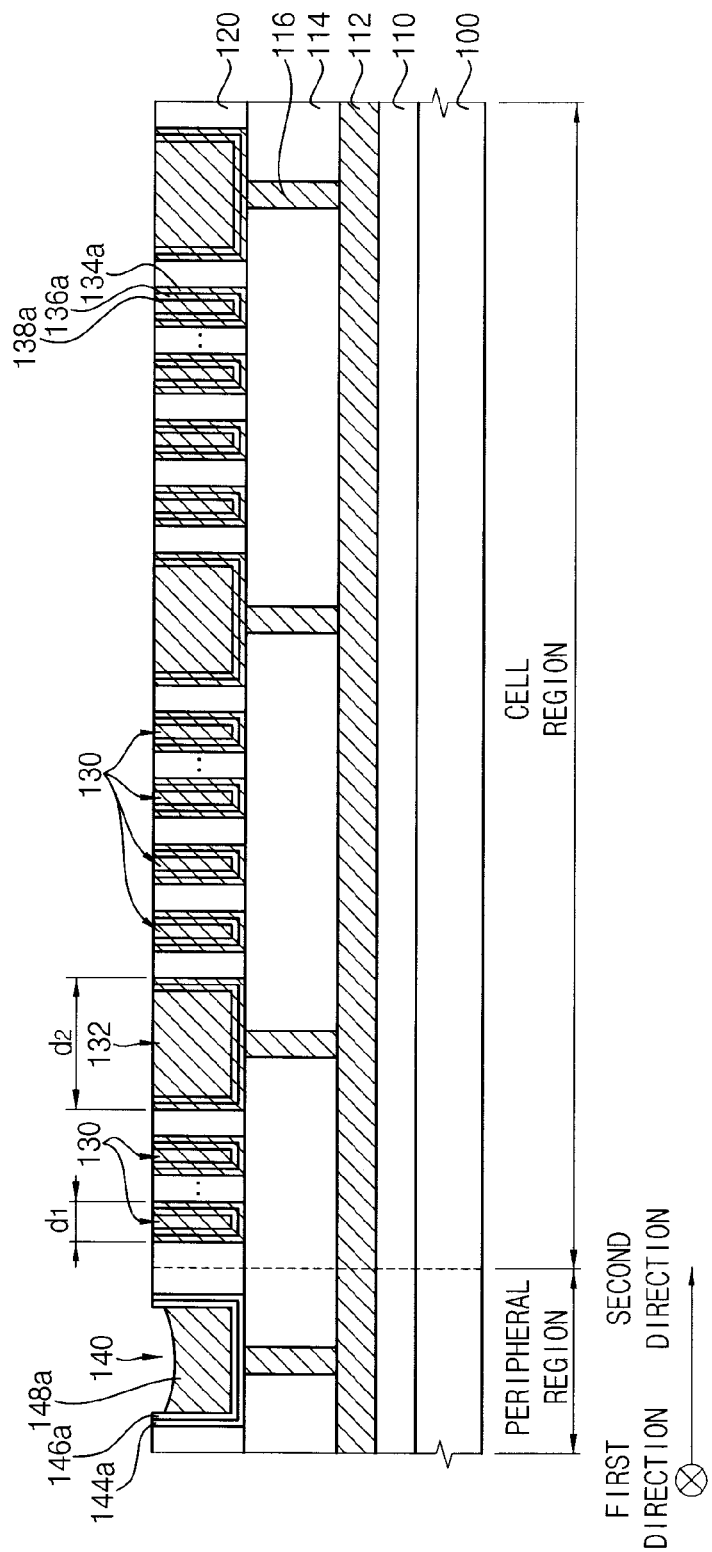

Referring to FIGS. 2 and 8, the copper layer 138, the copper seed layer 136 and the barrier metal layer 134 are then polished by a chemical mechanical polishing process so as to expose an upper surface of the third insulating interlayer 120. As a result, a first conductive pattern 130 is formed in the first trenches 122a, a second conductive pattern 132 is formed in the second trenches 122b and a conductive pattern 140 is formed in the third trench 122c.

Figure 9:
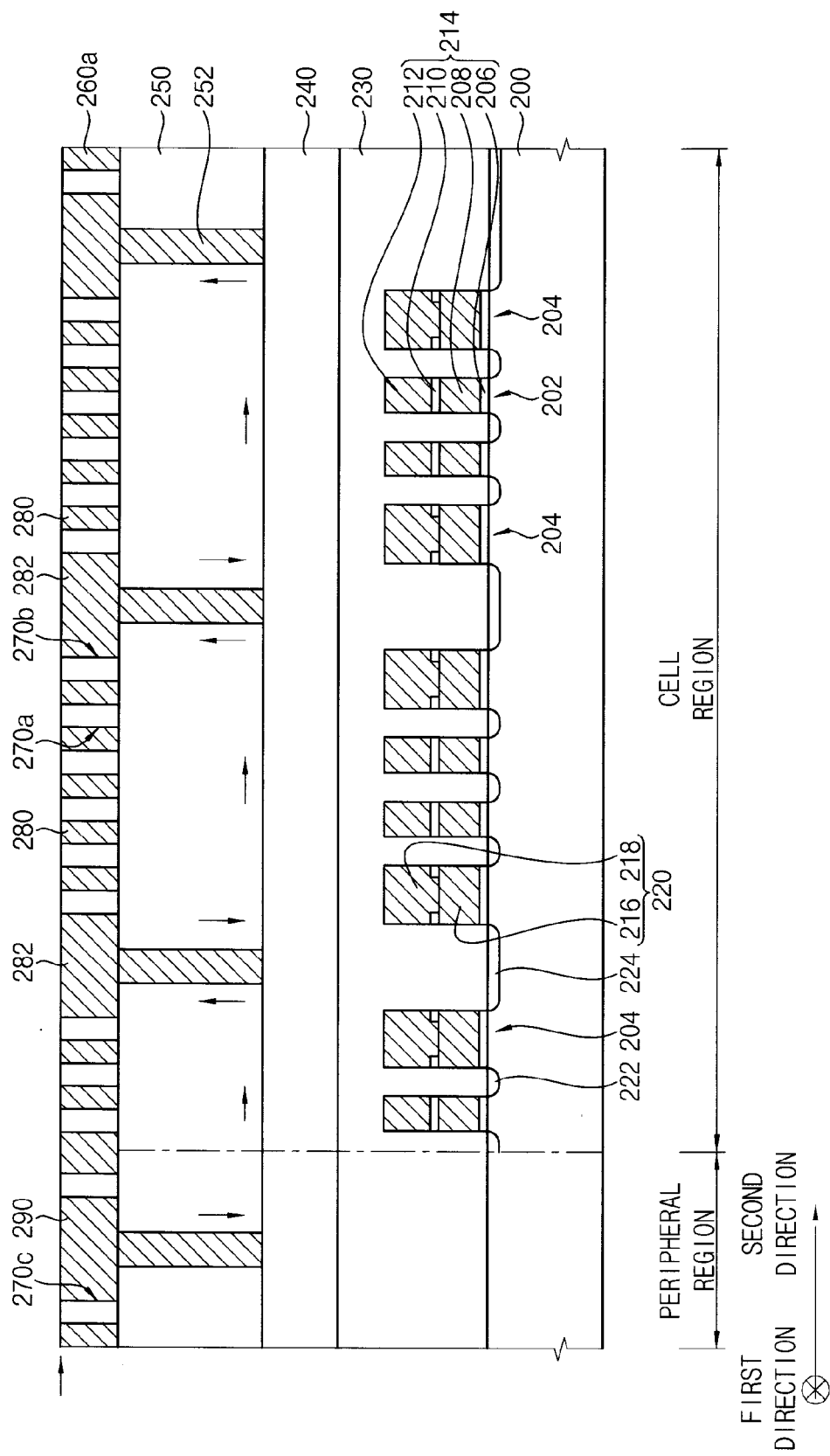
FIG. 9 is a cross-sectional view of a NAND flash memory device including a conductive pattern structure in accordance with the inventive concept.
Figure 10:
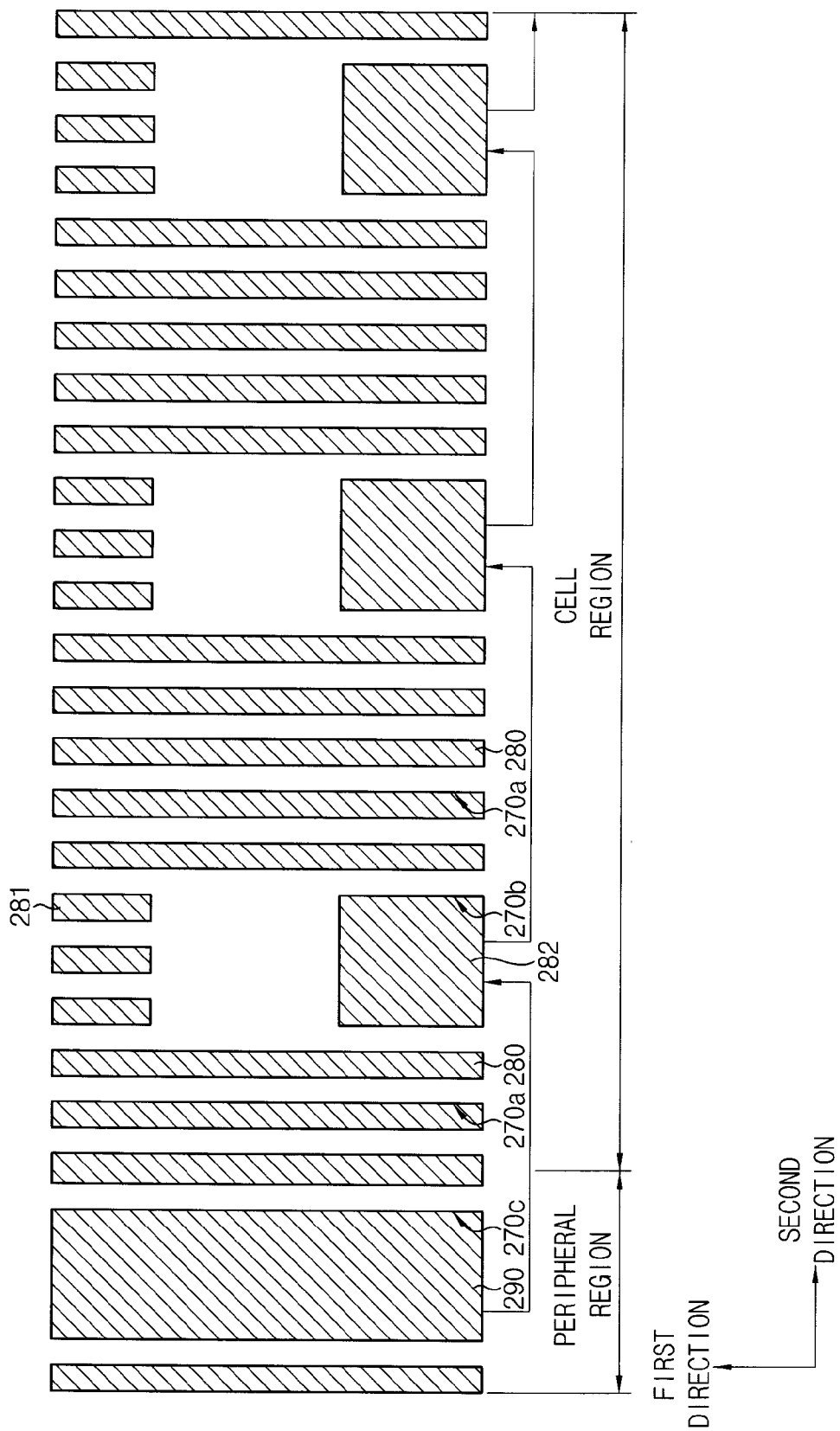
FIG. 10 is a plan view of copper wiring of the NAND flash memory device illustrated in FIG. 9.

An embodiment of a NAND flash memory device including a conductive pattern structure in accordance with the inventive concept will now be described with reference to FIGS. 9 and 10.

The NAND flash memory device of this example includes strings of transistors each constituting a cell on an active region of a substrate 200. The substrate 200 is a semiconductor substrate of single crystalline silicon or silicon-germanium, for example. The transistors constituting each cell include cell transistors 202, and a cell selecting transistor and a ground selecting transistor 204. The string may include 16 or 32 cell transistors 202 connected in series, and cell selecting and ground selecting transistors 204 at both ends of the serially connected cell transistors 202.

The cell transistors 202 in this example each include a first gate structure 214 including a tunnel oxide layer pattern 206, a charge storing layer pattern 208 of charge trapping polysilicon or silicon nitride, a dielectric layer pattern 210 and a control gate pattern 212 disposed one atop the other in the foregoing order, and a first impurity doped region 222 provided in upper portions of the substrate 200 at both sides of the first gate structure 214. Each cell selecting transistor and the ground selecting transistor 204 of this example includes a second gate structure including a gate oxide layer pattern 216 and a gate electrode 218 disposed on the oxide layer pattern 216, and a second impurity doped region 224 provided in upper portions of the substrate 200 at both sides of the second gate structure 220.

In this example, tunnel oxide layer pattern 206 and gate oxide layer pattern 216 may be formed using at least one material including silicon oxide, silicon oxynitride, and impurity doped silicon oxide.

The second impurity doped region 224 at one side of the ground selecting transistor 204 may serve as a common source region in which case it is connected to a common source line.

The NAND flash memory device of this example also includes a first insulating interlayer 230 covering the cell transistors 202 and the selecting transistors 204, a first metal wiring 240 disposed on the first insulating interlayer 230 and extending in a second direction, a second insulating interlayer 250 covering the first metal wiring 240, metal contacts 252 extending through the second insulating interlayer 250 and making contact with the first metal wiring 240, and a third insulating interlayer pattern 260a disposed on the second insulating interlayer 250 and the metal contacts 252. The NAND flash memory device may also include contact plugs (not illustrated) extending through the first insulating interlayer 230 and making contact with the substrate 200 at the second impurity doped region, i.e., the common source region 224.

The third insulating interlayer pattern 260a contains copper wiring. More specifically, the third insulating interlayer pattern 260a has first trenches 270a, second trenches 270b and a third trench 270c therein. In the trenches 270a-270c, a first conductive pattern 280, a second conductive pattern 282 and a current-distributing conductive pattern 290 are provided, respectively. The conductive segments constituting the second conductive pattern 282 contact or are otherwise electrically connected to the underlying metal contacts 252, respectively. The form and function of the conductive patterns 280, 282 and 290 are similar to those (130, 132 and 140) described above in connection with the conductive pattern structure of FIGS. 1 and 2. Therefore, reference may be made to such a description in addition to that which follows.

In particular, the first conductive pattern 280 and the second conductive pattern 282 serve as electric power supply lines. In addition, the first and second conductive patterns 280 are each constituted by conductive lines (linear segments of conductive material) extending in the same first direction.

Furthermore, each conductive line constituting the second conductive pattern 282 is interposed between respective ones of conductive lines constituting the first conductive patterns 280, and the second conductive pattern 282 has a greater line width than the first conductive pattern 280. Also, most of the conductive lines constituting the first conductive pattern 280 extend in the first direction from one side to the other of each cell. On the other hand, other conductive lines 281 constituting first conductive pattern 280 are relatively short and are disposed in the same rows as the conductive lines constituting the second conductive pattern 282.

The current-distributing conductive pattern 290 is disposed adjacent the first conductive pattern 280 in the peripheral region. The current-distributing conductive pattern is constituted by at least one conductive line extending in the first direction, i.e., disposed in parallel to those constituting the first and second conductive patterns 282 in the cell region. The current-distributing conductive pattern 290 contacts or is otherwise electrically connected to the underlying first metal wiring 240. Furthermore, the line width of the current-distributing conductive pattern 290 is the same as or greater than that of the second conductive pattern 282.

Accordingly, electroplating current is distributed from a cell block near the edge of the substrate 200 to a cell block at the center of the substrate 200. That is, the electroplating current supplied to the current-distributing conductive pattern 290 may distributed from the current-distributing conductive pattern 290 to all of the cell blocks through the first metal wiring 240. Thus, the electroplating current is not discharged from those conductive lines constituting the second conductive pattern 282 nearest to the edge of the substrate 200. Accordingly, voids are prevented from being formed in the conductive patterns serving as wiring for the device.

A method of manufacturing the NAND flash memory device illustrated in and described with reference to FIGS. 9 and 10 will now be described with reference to FIGS. 11 to 24.

Figure 11:
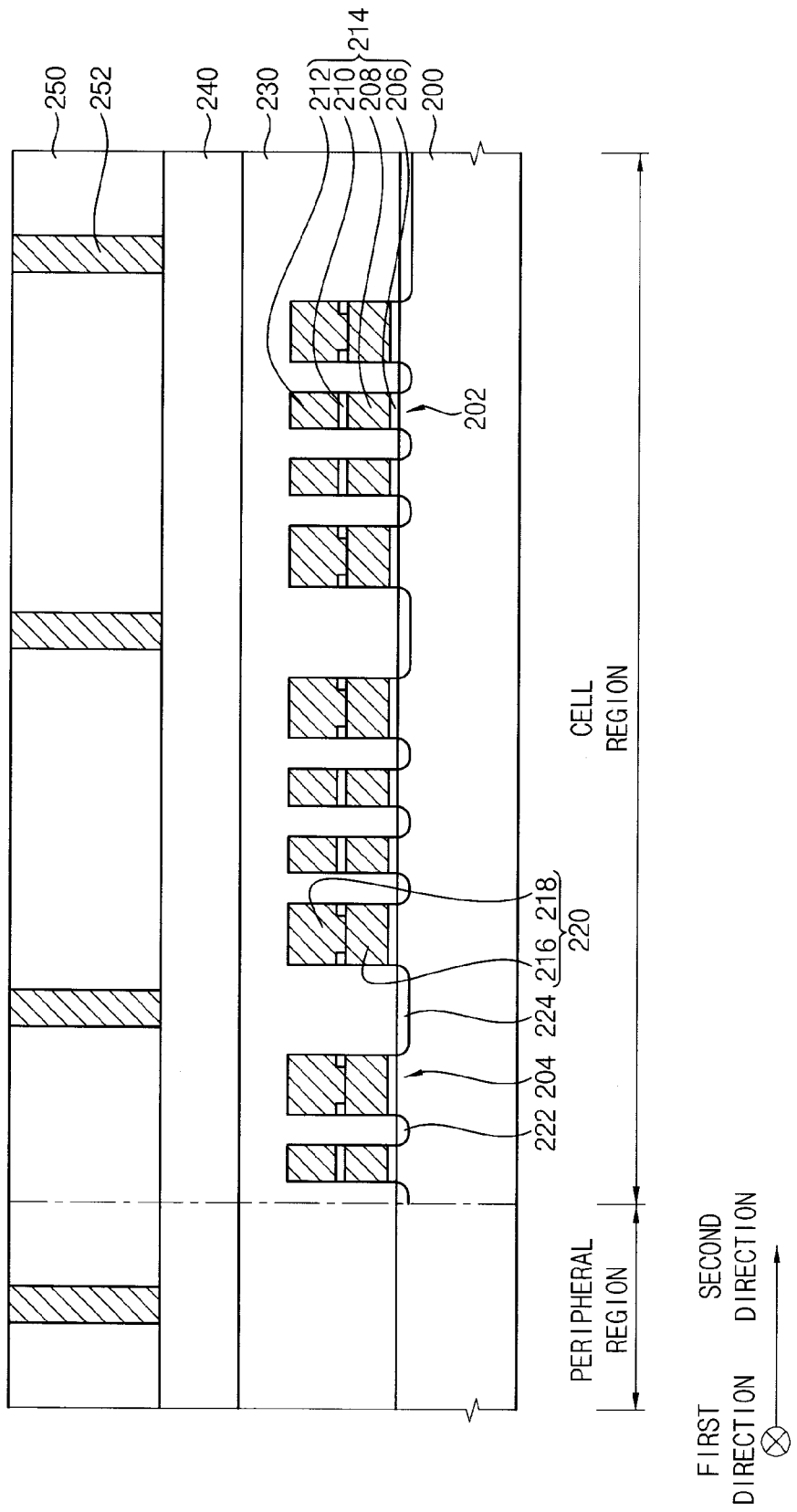
FIGS. 11 to 18 are cross-sectional views of the NAND flash memory device of FIGS. 9 and 10 during the course of a method of manufacturing the same in accordance with the inventive concept.

Referring first to FIG. 11, a device isolation layer pattern (not illustrated) for defining an active region is formed by a device isolation process in substrate 200.

Next, cell transistors 202 and selecting transistors 204 are formed on the active region of the substrate 200 in the cell region of the device.

For example, tunnel oxide layer pattern 206 and gate oxide layer pattern 216 are formed by a thermal oxidation process at an upper portion of the substrate 200. Charge storing layer pattern 208, dielectric layer pattern 210 and control gate pattern 212 are formed by depositing a preliminary charge storing layer, forming a dielectric layer on the preliminary charge storing layer, and then removing a portion of the dielectric layer for forming the selecting transistors 204. Subsequently, a conductive layer is formed on what remains of the dielectric layer and the preliminary charge storing layer. The conductive layer, the dielectric layer and the preliminary charge storing layer are then patterned. As a result, first and second gate structures 214 and 220 are formed.

Next, the substrate 200 is doped with impurities at both sides of first and second gate structures 214 and 220 to form impurity doped regions 222 and 224. In this case, the impurity doped region at the outer side of a ground selecting transistor will become a common source region 224.

Then, first insulating interlayer 230 is formed on the substrate 200 over the cell transistors 202 and the selecting transistors 204. Contact plugs (not illustrated) may be formed through the first insulating interlayer 230. In an example of this embodiment, the contact plugs are by etching the first insulating interlayer 230 to form first contact holes (not illustrated), and then filling the first contact holes with conductive material.

Next, first metal wiring 240 is formed on the first insulating interlayer 230. The first metal wiring 240 may be formed by deposition and patterning processes or by a damascene process. In the latter case, the first metal wiring 240 may include a barrier metal layer and a tungsten or copper pattern in the barrier metal layer.

Then second insulating interlayer 250 is formed over the first metal wiring 240, and metal contacts 252 are formed in the second insulating interlayer 250. In this embodiment, the metal contacts 252 are formed by etching the second insulating interlayer 250 to form second contact holes exposing portions of an upper surface of the first metal wiring 240, respectively, and then filling the second contact holes with metal. The second contact holes are formed in both the cell region and in the peripheral region of the device. Accordingly, a metal contact(s) 252 is/are formed in the peripheral region.

Figure 12:
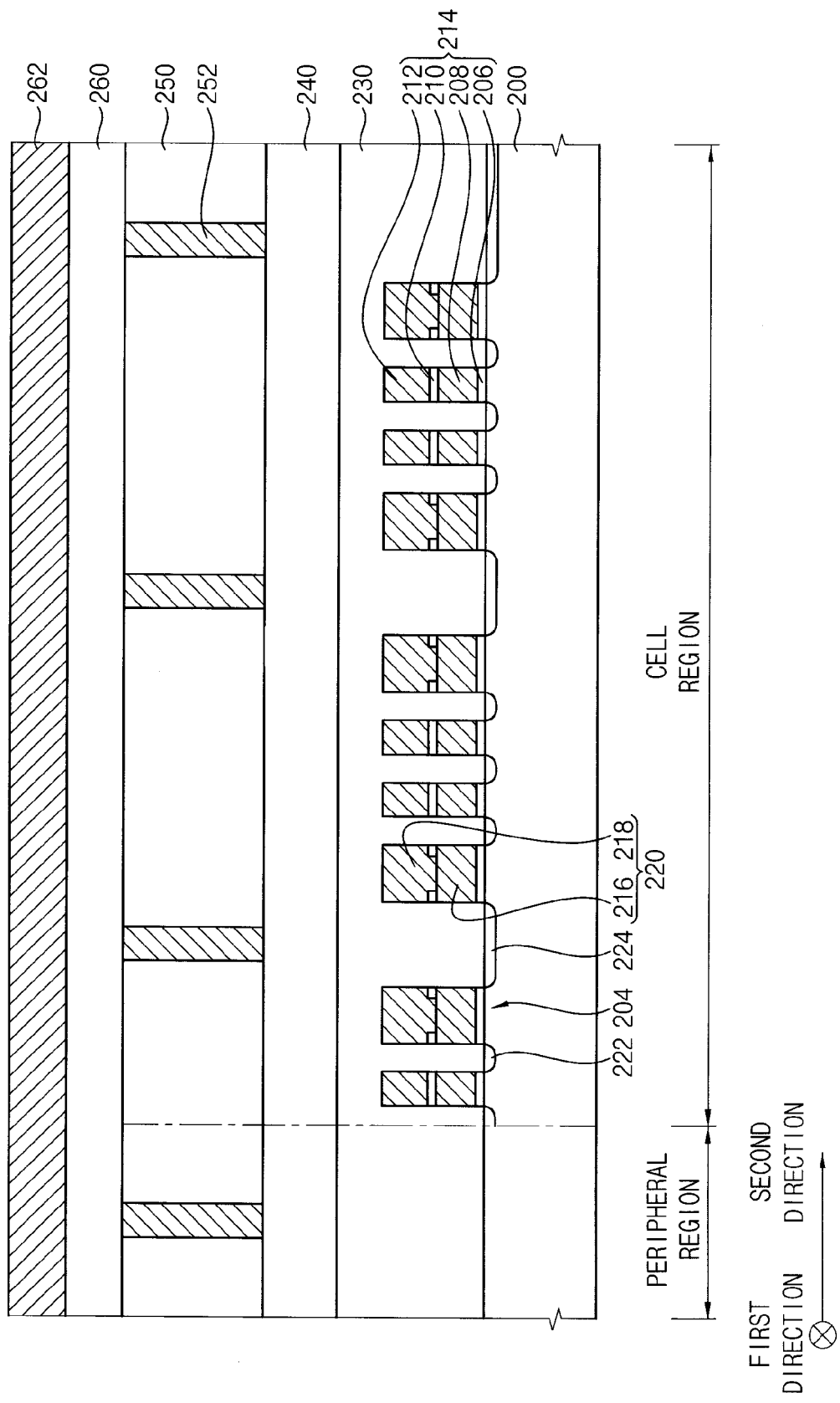

Referring to FIG. 12, third insulating interlayer 260 and a mask layer 262 are sequentially formed on the second insulating interlayer 250. In this respect, the mask layer 262 may be formed of polysilicon.

Figure 13:
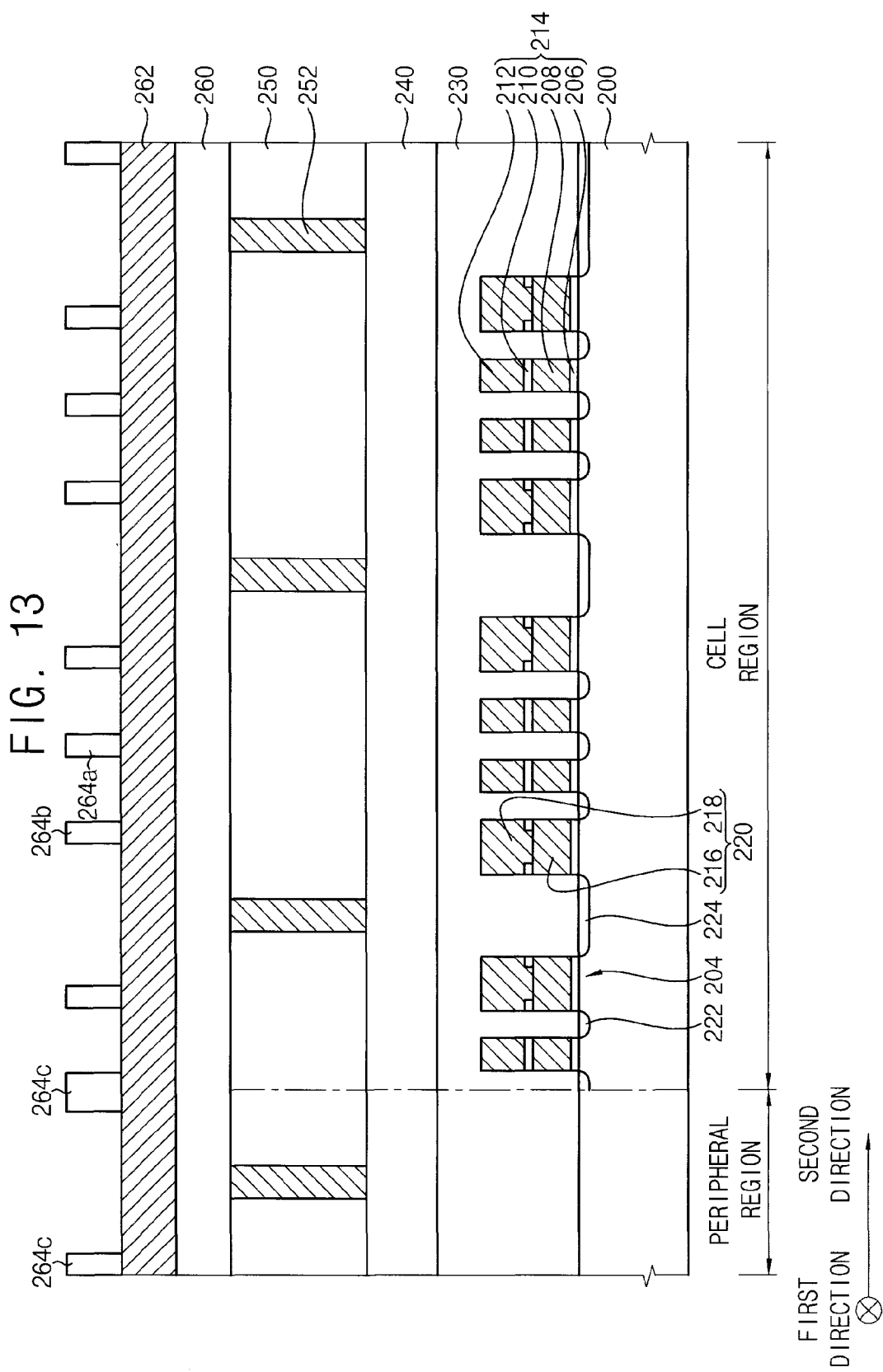
Figure 19:
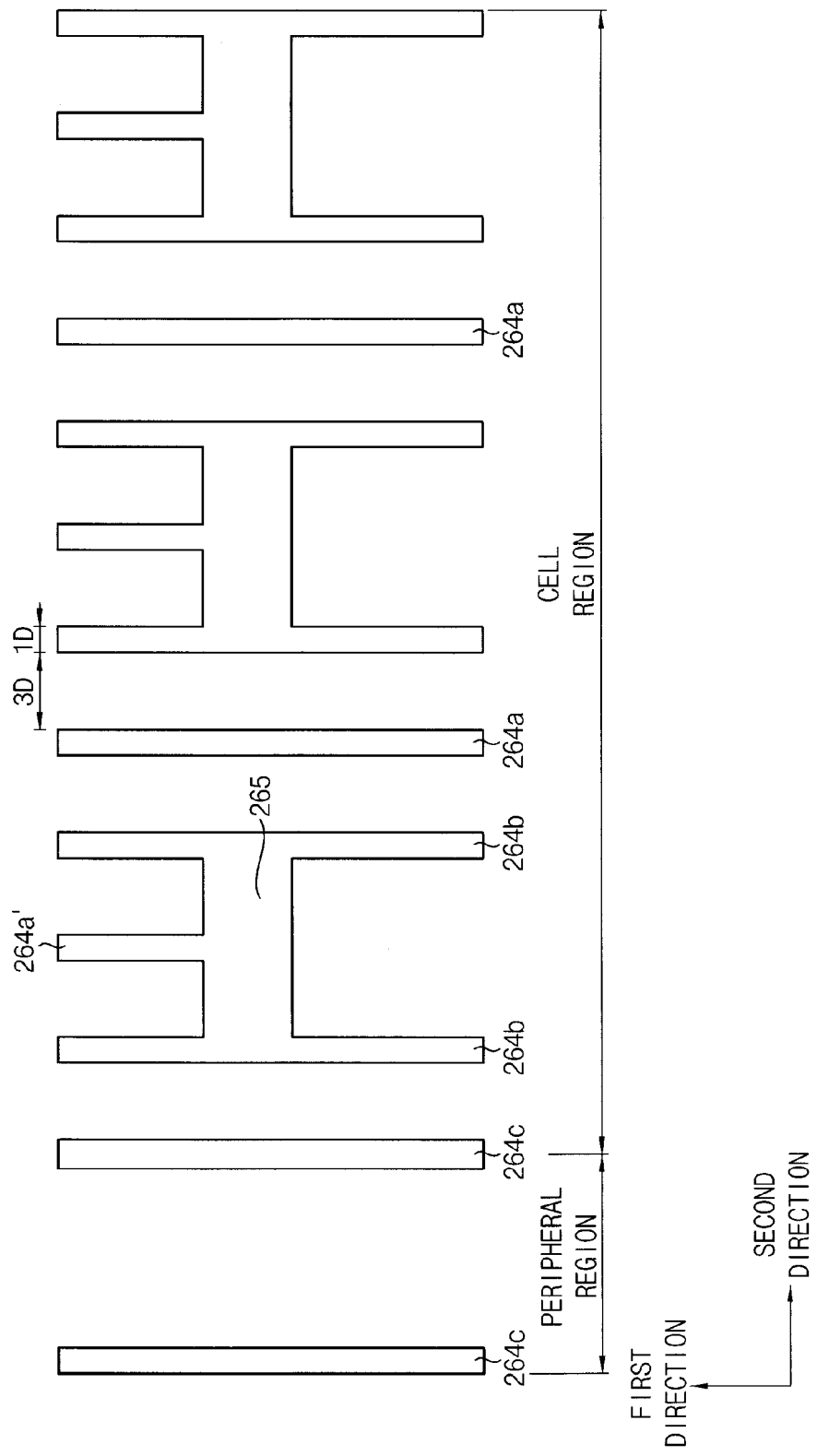
FIGS. 19 to 24 are plan views of the NAND flash memory device of FIGS. 9 and 10 during the course of a method of manufacturing same in accordance with the inventive concept.

Referring to FIGS. 13 and 19, a spin-on mask is formed on the mask layer 262. The spin-on mask includes a line pattern having a first line width 1D.

More specifically, the spin-on mask has a first pattern of long (first) lines 264a and short (first) lines 264a' each extending lengthwise in a first direction in the cell region. The long lines 264a of the first pattern extend from one side to the other of a cell block of the semiconductor device. The short lines 264a' of the first pattern are shorter than lines 264a and terminate adjacent a center line of the cell block.

The spin-on mask also has a second pattern in the cell region constituted by pairs of (second) lines 264b. Each of the lines 264 also extends lengthwise in the first direction. Each pair of lines 264b of the second pattern is interposed between respective ones the long lines 264a of the first pattern as spaced therefrom, respectively, by distances 3D (distances each equal to three times the line width 1D).

The second lines 264b of each pair are spaced from each other by a distance greater than 3D.

The spin-on mask also has a connecting spin-on mask pattern of segments 265 each of which connects a respective pair of the lines 264b of the second pattern to at least three of the short lines 264a' of the first pattern. To this end, the segments 265 of the connecting spin-on mask pattern are each elongated in a second direction perpendicular to the first direction.

The spin-on mask also has a third spin-on mask pattern in the peripheral region and comprising a pair of lines 264c each extending lengthwise in the first direction. In this embodiment, the lines 264c of the third spin-on mask pattern are spaced from each other by a distance greater than 3D and with respect to the neighboring cell region, are disposed closest to a long line 264 of the first spin-on mask pattern of the mask.

Figure 14:
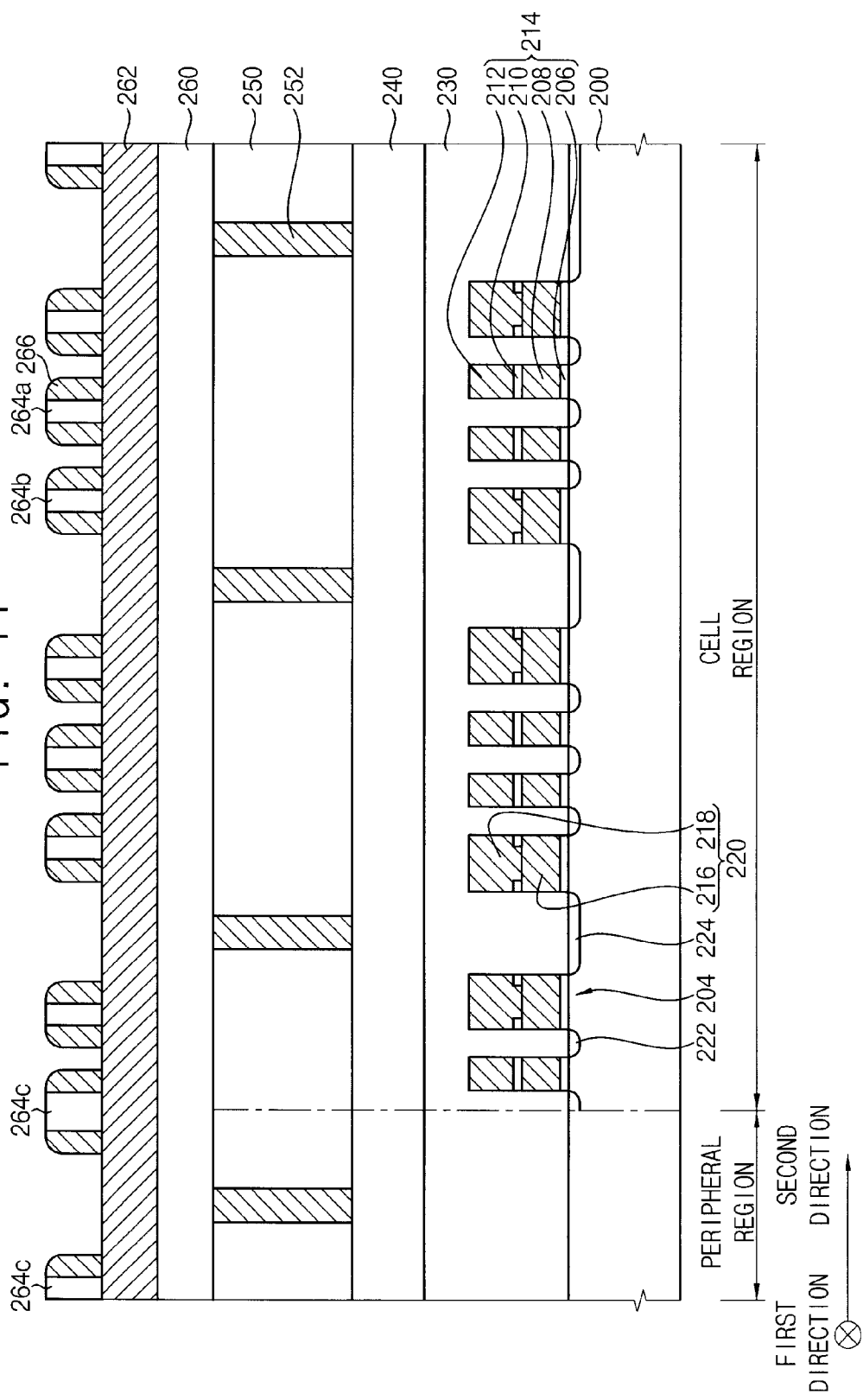
Figure 20:
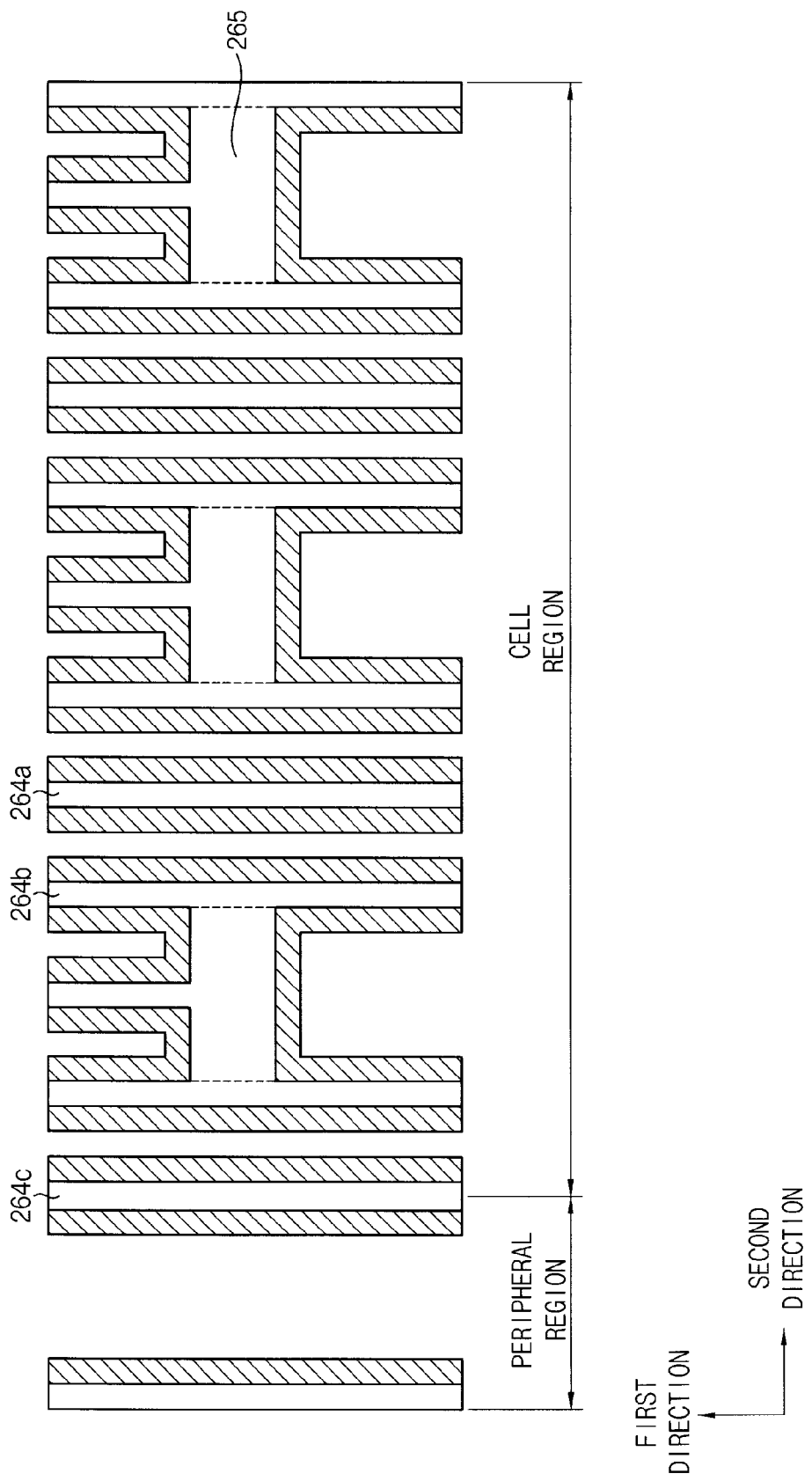

Referring to FIGS. 14 and 20, a spacer layer is conformally formed on the spin-on mask. The spacer layer may be formed to a thickness equal to the line width 1D of the line pattern of the spin-on mask. The spacer layer is then anisotropically etched to form spacers 266 on sidewall surfaces of the spin-on mask patterns. The spacers 266 preferably have the same widths as the line pattern of the spin-on mask.

Figure 15:
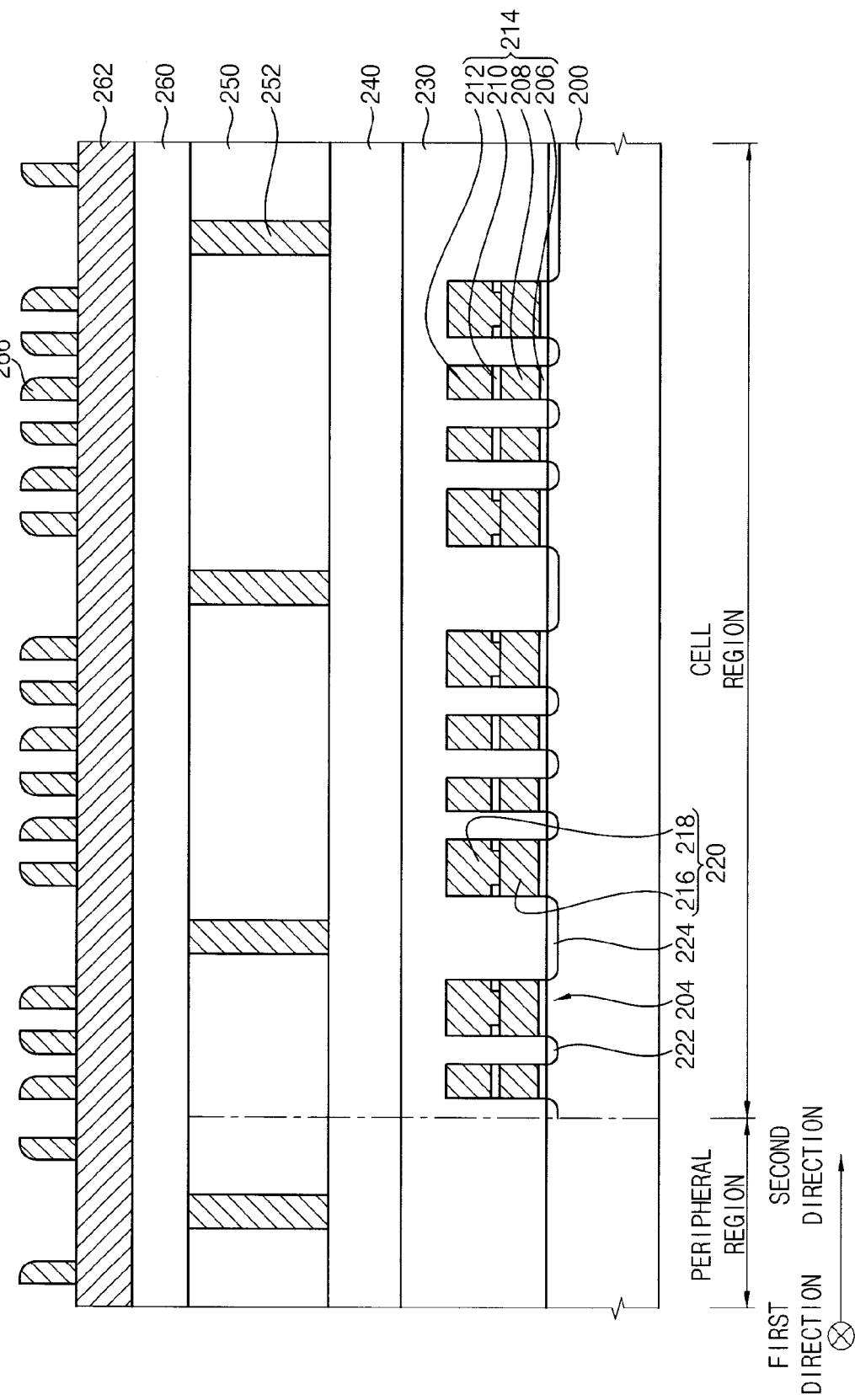
Figure 21:
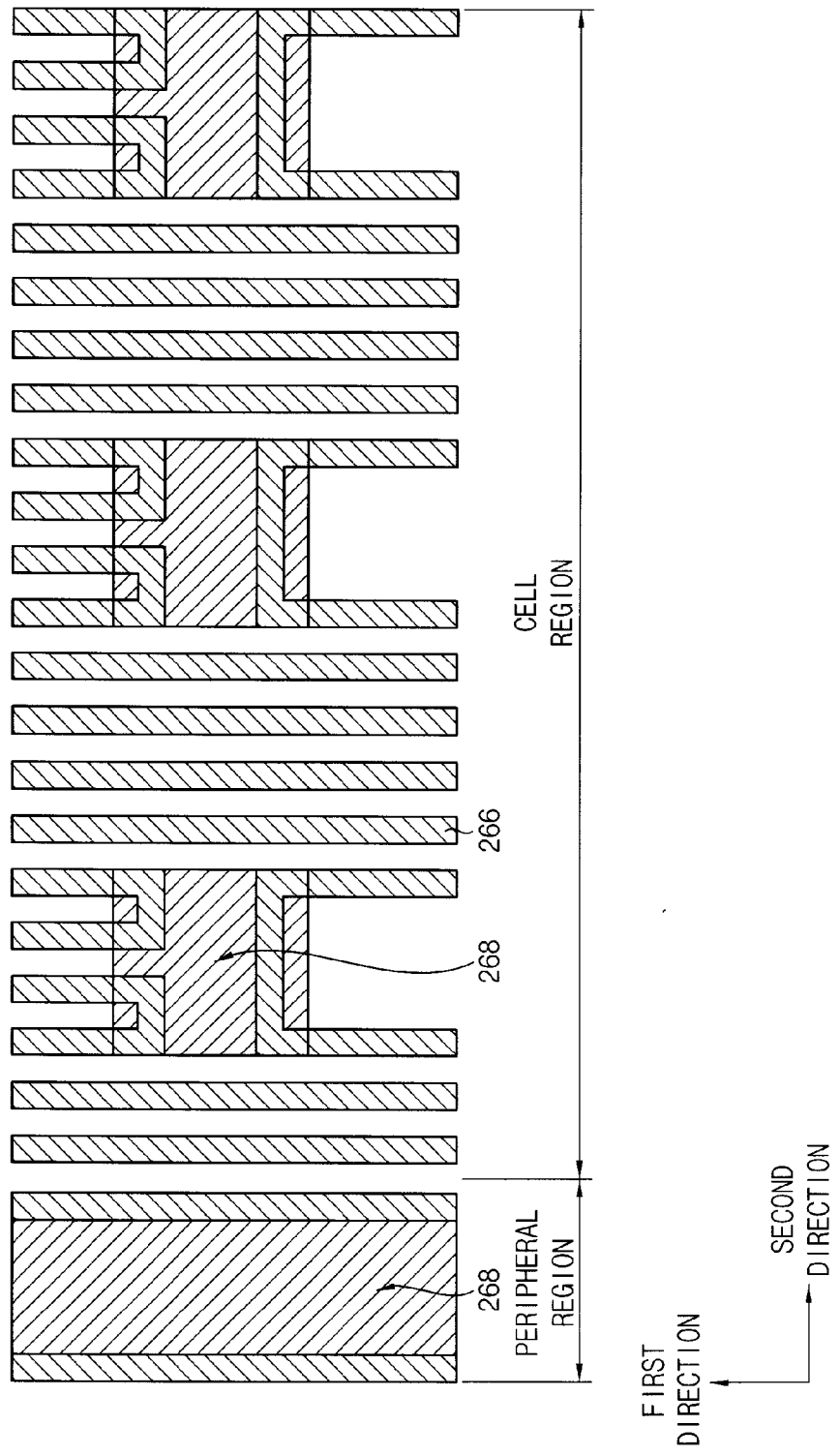

Referring to FIGS. 15 and 21, the spin-on mask patterns are removed to leave only the spacers 266 on the mask layer 262. Then a photoresist layer is formed on the mask layer 262 over the spacers 266, and is patterned to form photoresist pattern 268.

Figure 16:
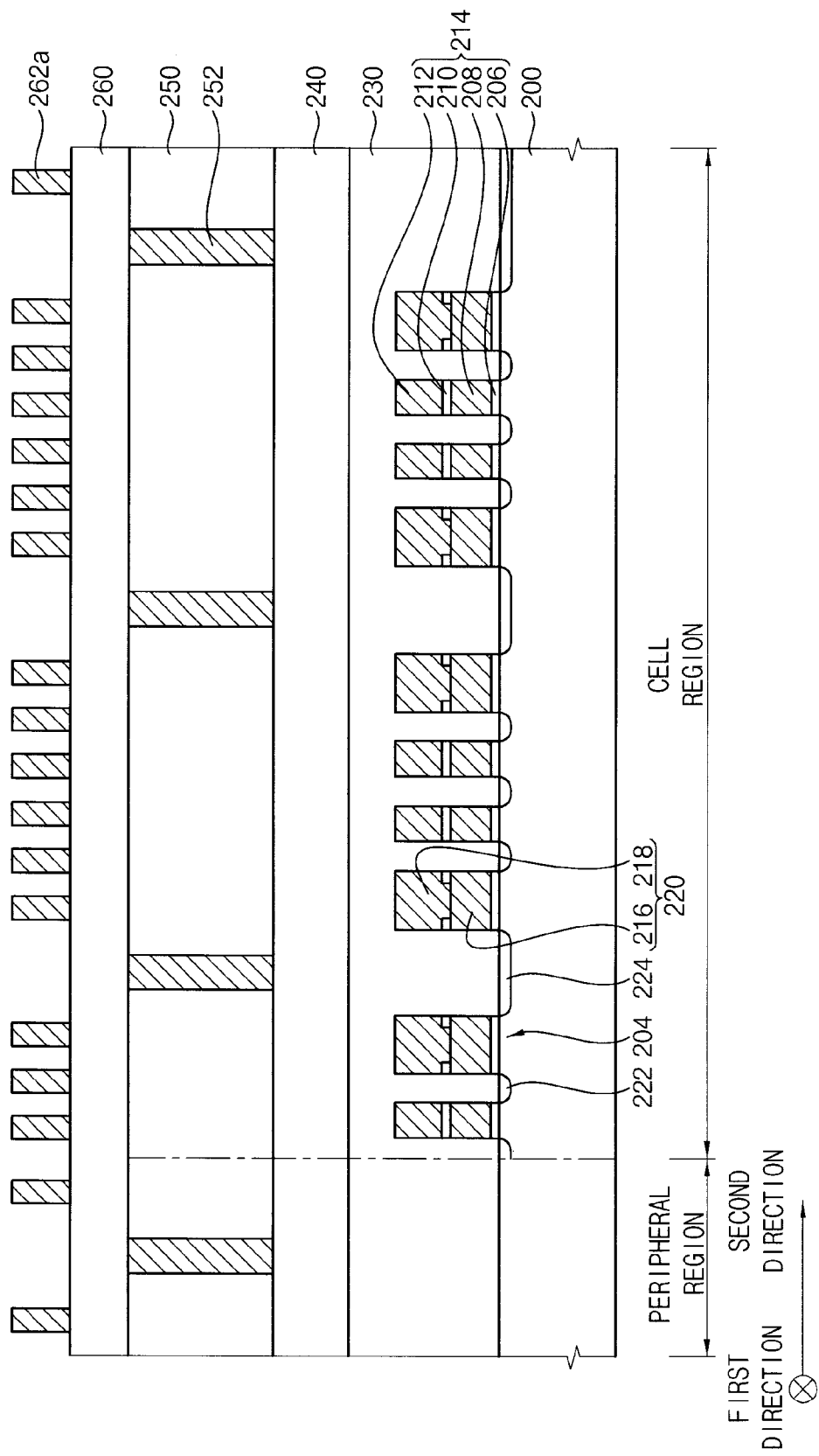
Figure 22:
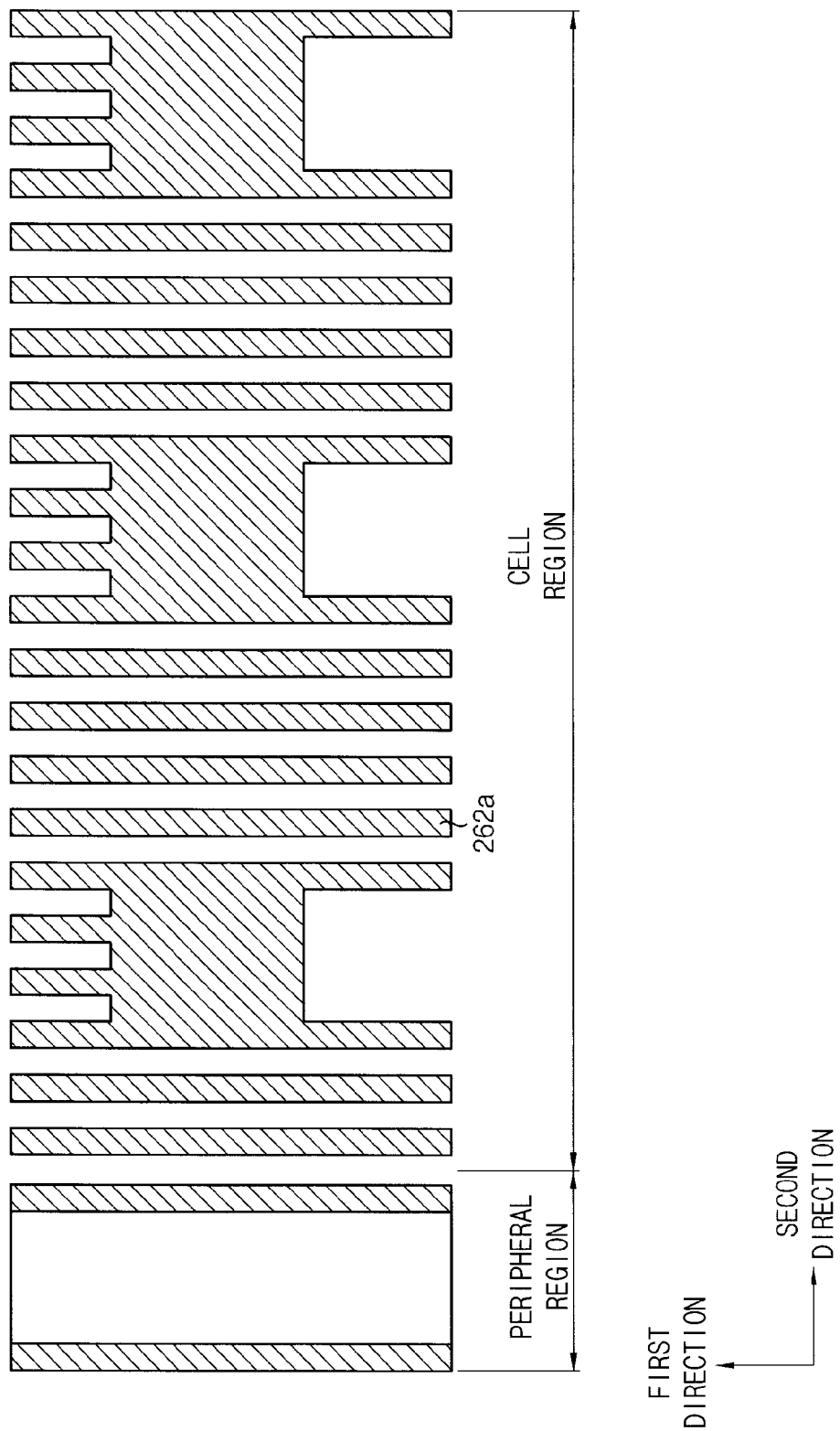

Referring to FIGS. 16 and 22, the mask layer 262 is etched using the photoresist pattern 268 and the spacers 266 as an etching mask to form mask pattern 262a.

Figure 17:
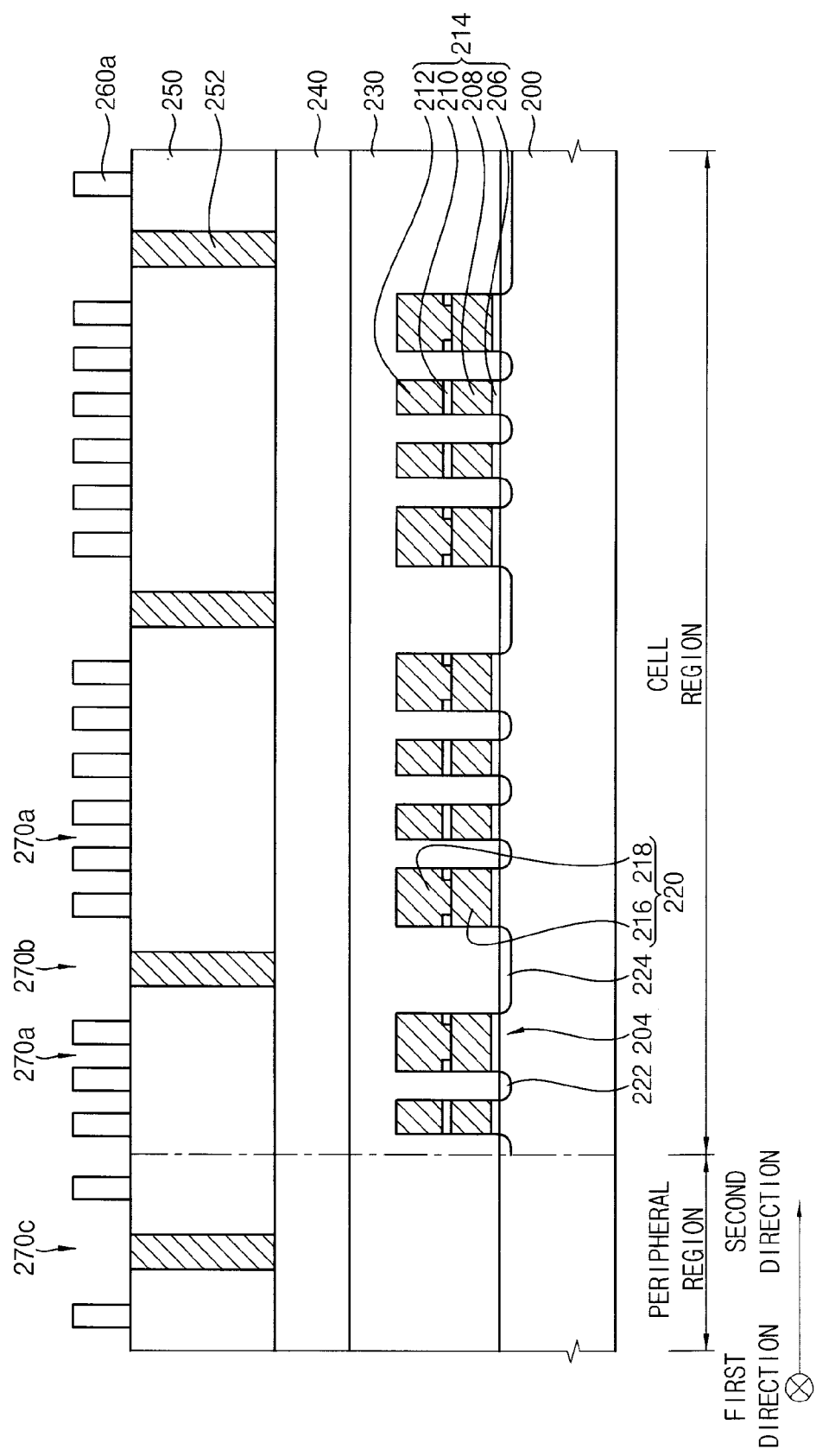
Figure 23:
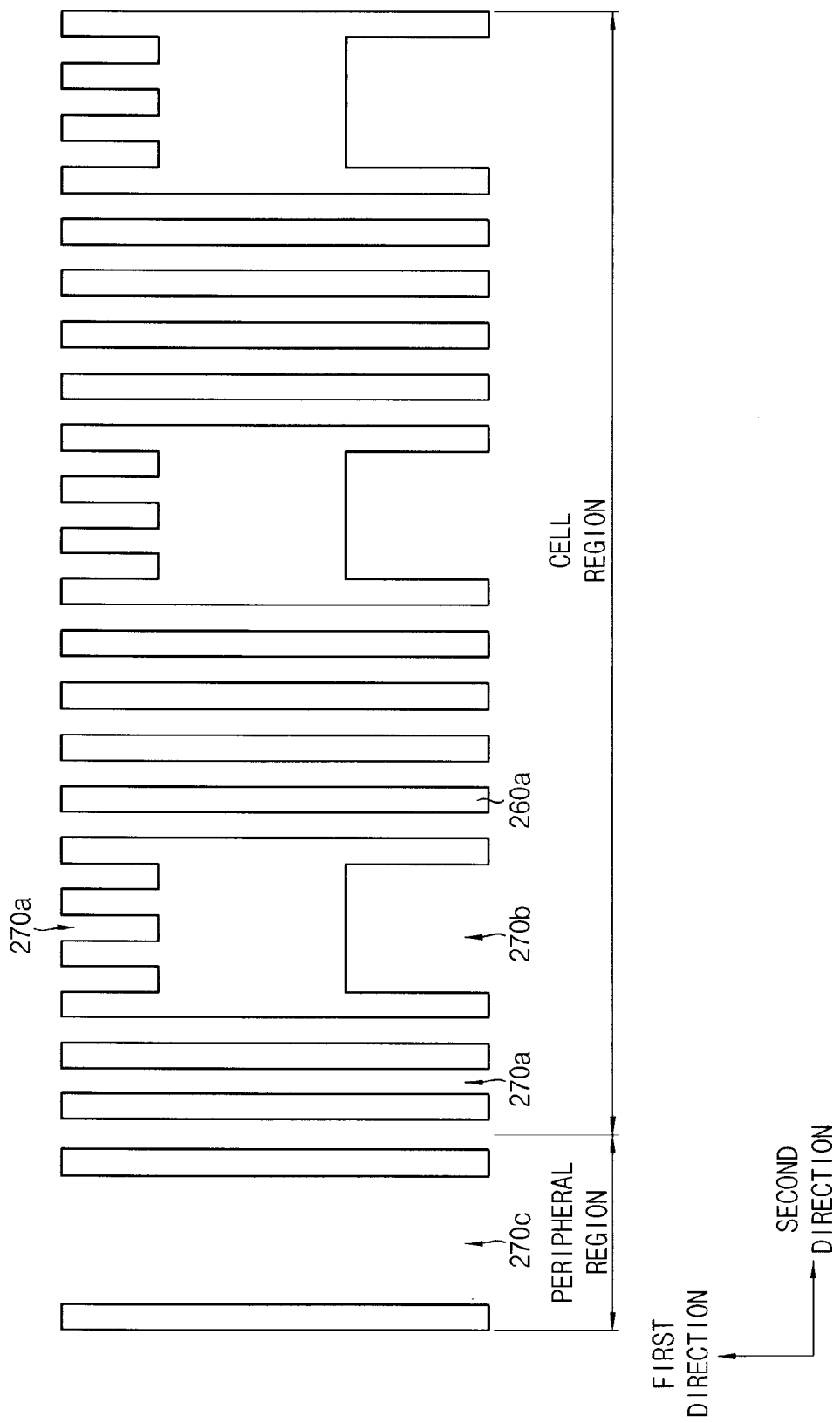

Referring to FIGS. 17 and 23, the third insulating interlayer 260 is etched using the mask pattern 262a as an etching mask to form third insulating interlayer pattern 260a including first to third trenches 270a-270c. Refer to FIG. 9 and the description thereof regarding the form of the trenches 270a-270c.

Figure 18:
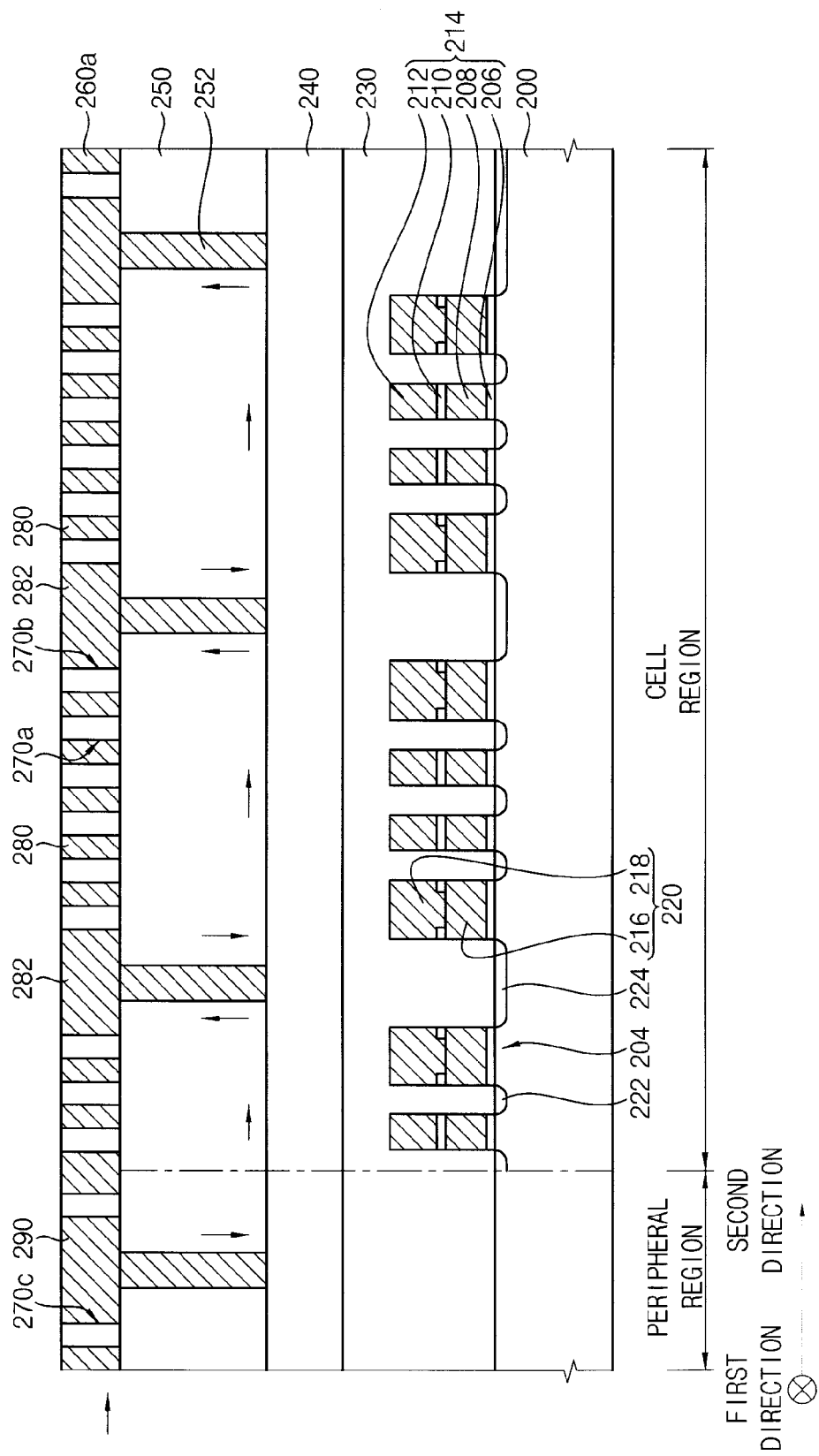
Figure 24:
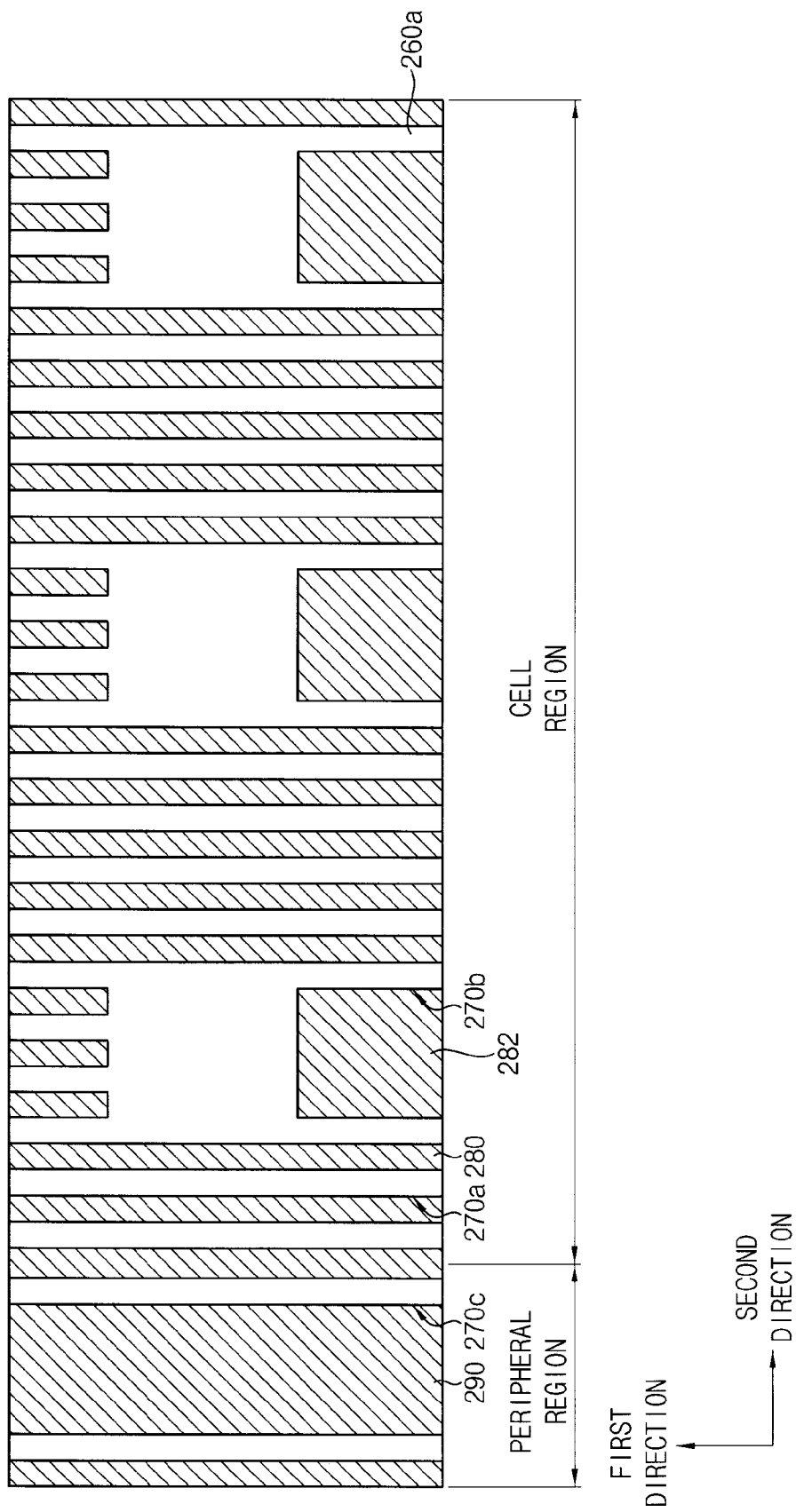

Referring to FIGS. 18 and 24, a barrier metal layer (not illustrated) and a copper seed layer (not illustrated) are subsequently formed along the trenches 270a-270c and the third insulating interlayer pattern 260a. A copper layer (not illustrated) is formed on the copper seed layer to such a thickness as to fill the trenches 270a-270c. The barrier metal layer may be formed by a physical vapor deposition process or a chemical vapor deposition process. The copper seed layer may be formed by the physical vapor deposition process. The copper layer is formed by an electroplating process in which a voltage is impressed across the substrate 200 to generate electroplating current.

The direction in which the voltage is impressed is perpendicular to the lengthwise direction of the trenches 270a-270c, i.e., is perpendicular to the first direction, at upper and bottom portions of the substrate 200. Furthermore, in this embodiment, the third trenches 270c are formed at the same level as the second trenches 270b. Accordingly, the electroplating current is distributed by the copper seed layer in the third trenches 270c to the cell region. Therefore, the current does not merely discharge or dissipate from (the copper seed layer in) the second trenches 270b. Accordingly, the copper layer fills the second trenches 270b completely in the chip and in general, voids are prevented from forming in the copper layer in the cell region.

The resulting copper layer may then be polished by a chemical mechanical polishing process until an upper surface of the third insulating interlayer pattern 260a is exposed. As a result, a first conductive pattern 280 is formed in the first trenches 270a, a second conductive pattern 282 is formed in the second trenches 270b and a current-distributing conductive pattern 290 is formed in the third trench 270c.

The first conductive pattern 280 may be used as conductive wiring for applying a voltage to bit lines, and the second conductive pattern 282 may be used as wiring for applying a voltage to common source lines, for example. The current-distributing conductive pattern 290 does not serve as a practical wiring in the device but is merely provided as the result of distributing the electroplating current in such a way that the first and second conductive patterns 280 and 282 are formed substantially uniformly and to the desired thickness without the presence of voids therein.

Figure 25:
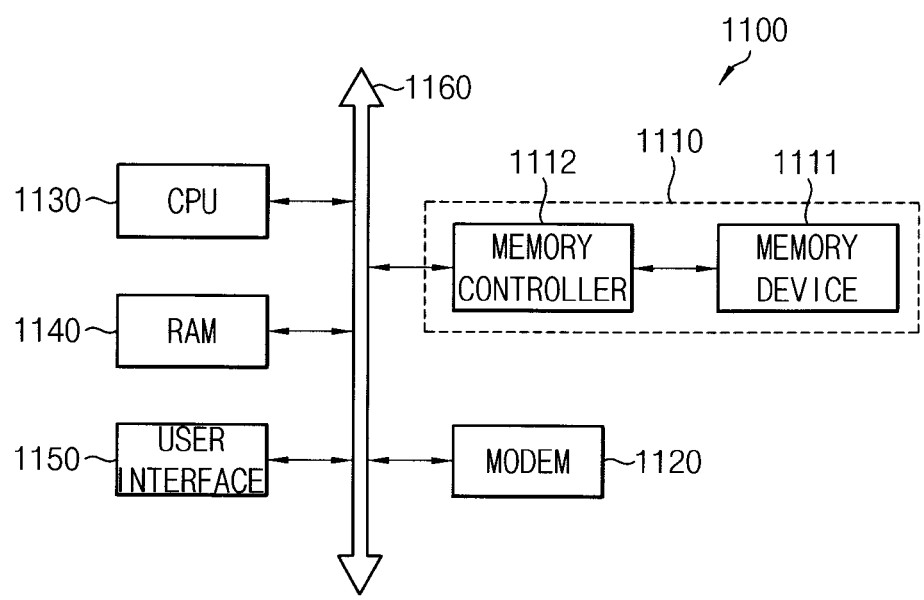
FIG. 25 is a block diagram of an information processing system including a semiconductor device having a conductive pattern structure in accordance with the inventive concept.

An information processing system including a conductive wiring structure or a semiconductor device including the same, in accordance with the inventive concept, will now be described with reference to FIG. 25. That is, referring to FIG. 25, the information processing system 1100 of this example includes a memory device 1111 having a conductive pattern structure in accordance with the inventive concept. The memory device may be a flash memory device of the type described above.

More specifically, the information processing system 1100 includes a memory system 1110 comprising the memory device 1111 and a memory controller 1112, a modem 1120, a central processing unit 1130, a ram 1140 and a user interface 1150 electrically connected to one another by a system bus 1160. The memory system 1110 may store data processed by the central processing unit 1130 or inputted from outside the system 1100.

The information processing system 1100 may also include an application chipset, a camera image processor (CIS), a mobile DRAM, an input/output apparatus, etc.

The memory system 1110 of this example may be specifically embodied as a solid state drive (SSD) for storing a large volume of data stably. Applying the inventive concept to such a memory system 1110 enhances its reliability so that resources required for correcting errors are saved and its data exchanging function is improved.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A conductive pattern structure having a cell region and a peripheral region outside the cell region, the conductive pattern structure comprising:
    a substrate;
    a first insulating interlayer disposed on the substrate and extending in the cell region and the peripheral region of the conductive pattern structure;
    metal wiring on the first insulating interlayer and extending in both the cell region and the peripheral region;
    a second insulating interlayer on the first insulating interlayer and covering the metal wiring, and first metal contacts and a second metal contact extending through the second interlayer insulating layer, the first metal contacts each contacting the metal wiring in the cell region and the second metal contact contacting the metal wiring in the peripheral region;
    a third insulating interlayer on the second insulating interlayer and extending in the cell region and the peripheral region;
    a cell current-distributing conductive pattern extending through the third insulating interlayer in the cell region and constituted by segments of conductive material contacting the first metal contacts, respectively; and
    a peripheral current-distributing conductive pattern extending through the third insulating interlayer in the peripheral region and contacting the second metal contact.

2. The conductive pattern structure of claim 1, wherein the peripheral current-distributing conductive pattern is thinner, at a central portion thereof, than the cell current-distributing conductive pattern.

3. The conductive pattern structure of claim 1, further comprising a first conductive pattern extending through the third insulating interlayer in the cell region and constituted by first conductive segments that do not contact any conductive contact that extends through the second insulating interlayer and into contact with the metal wiring.

4. The conductive pattern structure of claim 3, wherein each of the conductive patterns is of a plurality of layers comprising a barrier metal layer pattern, a copper seed layer pattern and a copper layer pattern disposed one inside the other in the foregoing order.

5. The conductive pattern structure of claim 3, wherein the cell current-distributing conductive pattern and the first conductive pattern each comprises line segments of conductive material, and the line width of the cell current-distributing conductive pattern is greater than a line width of the first conductive pattern.

6. The conductive pattern structure of claim 1, wherein the peripheral current-distributing conductive pattern comprises at least one line segment of conductive material, and the line width of the peripheral current-distributing conductive pattern is the same as or greater than the line width of the cell current-distributing conductive pattern.

7. A method of manufacturing a structure having a cell region and a peripheral region located outside the cell region, the method comprising:
    forming a first insulating interlayer on a substrate including in the cell region and a peripheral region;
    forming a metal wiring on the first insulating interlayer;
    forming, on the first insulating interlayer, a second insulating interlayer having first metal contacts extending therethrough in the cell region and a second metal contact extending therethrough in the peripheral region, the first and second metal contacts each contacting the metal wiring;

forming a third insulating interlayer on the second insulating interlayer;

etching the third insulating interlayer to form trenches therethrough in the cell region and in the peripheral region that expose the first and second metal contacts, respectively; and filling the trenches with copper including by performing an electroplating process.

8. The method of claim 7, wherein the filling of the trenches with copper comprises:

forming, along surfaces of the third insulating interlayer delimiting the trenches, conductive material comprising a copper seed layer;

electroplating on the structure having the copper seed layer form a copper layer which fills the trenches and covers an upper surface of the third insulating interlayer; and polishing the copper layer and the seed copper layer to expose an upper surface of the third insulating interlayer.

9. The method of claim 8, wherein the forming of conductive material conformally along surfaces of the third insulating interlayer delimiting the trenches comprises forming a layer of barrier metal on the surfaces delimiting the trenches before the copper seed layer is formed.

10. The method of claim 7, wherein the filling of the trenches with copper comprises:

forming, along surfaces of the third insulating interlayer delimiting the trenches, conductive material comprising a copper seed layer;

immersing the substrate in a solution including copper; and generating electroplating current beginning at the copper seed layer in the trench in the peripheral region, wherein the current flows sequentially to the second metal contacts, the metal wiring, the first metal contacts and to the copper seed layer in the first trenches in the cell region.

11. The method of claim 7, wherein the width of each of the trench that exposes the second metal contact is the same as or greater than the width of each of the trenches that expose the first metal contacts.

12. The method of claim 7, wherein the etching of the third insulating interlayer comprises forming third trenches that do not expose any of the metal contacts formed in the second insulating interlayer, wherein the widths of the third trenches are less than those of the trenches that expose the first metal contacts.

13. The method of claim 7, further comprising forming memory devices at an upper portion of the substrate and with respect to the cell and peripheral regions, only in the cell region, before the first insulating interlayer was formed.

14. The method of claim 13, wherein the forming of the memory devices comprises forming transistors at the upper portion of the substrate in the cell region.

* * * * *